United States Patent
More et al.

(10) Patent No.: US 10,930,781 B2
(45) Date of Patent: Feb. 23, 2021

(54) P-TYPE STRAINED CHANNEL IN A FIN FIELD EFFECT TRANSISTOR (FINFET) DEVICE

(71) Applicant: Taiwan Semiconductor Manufacturing Co., Ltd., Hsinchu (TW)

(72) Inventors: Shahaji B. More, Hsinchu (TW); Huai-Tei Yang, Hsinchu (TW); Shih-Chieh Chang, Taipei (TW); Shu Kuan, Keelung (TW); Cheng-Han Lee, New Taipei (TW)

(73) Assignee: Taiwan Semiconductor Manufacturing Co. Ltd., Hsinchu (TW)

(*) Notice: Subject to any disclaimer, the term of this patent is extended or adjusted under 35 U.S.C. 154(b) by 0 days.

(21) Appl. No.: 16/710,156

(22) Filed: Dec. 11, 2019

(65) Prior Publication Data
US 2020/0111911 A1    Apr. 9, 2020

Related U.S. Application Data

(62) Division of application No. 15/922,681, filed on Mar. 15, 2018, now Pat. No. 10,510,889.

(60) Provisional application No. 62/592,264, filed on Nov. 29, 2017.

(51) Int. Cl.
| | | |
|---|---|---|
| *H01L 29/78* | (2006.01) | |
| *H01L 29/66* | (2006.01) | |
| *H01L 21/82* | (2006.01) | |
| *H01L 29/16* | (2006.01) | |
| *H01L 29/161* | (2006.01) | |
| *H01L 21/8234* | (2006.01) | |
| *H01L 29/10* | (2006.01) | |

(52) U.S. Cl.
CPC .. *H01L 29/7848* (2013.01); *H01L 21/823431* (2013.01); *H01L 29/1054* (2013.01); *H01L 29/16* (2013.01); *H01L 29/161* (2013.01); *H01L 29/66492* (2013.01); *H01L 29/66545* (2013.01); *H01L 29/66795* (2013.01); *H01L 29/66803* (2013.01); *H01L 29/785* (2013.01); *H01L 29/7834* (2013.01)

(58) Field of Classification Search
CPC ......... H01L 29/7848; H01L 21/823431; H01L 29/1054; H01L 29/66545; H01L 29/66795; H01L 29/785; H01L 29/78; H01L 29/66; H01L 21/82
USPC ....................................................... 257/408
See application file for complete search history.

(56) References Cited

U.S. PATENT DOCUMENTS

| | | |
|---|---|---|
| 9,093,530 B2 | 7/2015 | Huang et al. |
| 9,171,929 B2 | 10/2015 | Lee et al. |
| 9,214,555 B2 | 12/2015 | Oxland et al. |
| 9,236,267 B2 | 1/2016 | De et al. |
| 9,520,482 B1 | 12/2016 | Chang et al. |

(Continued)

*Primary Examiner* — Didarul A Mazumder
(74) *Attorney, Agent, or Firm* — Slater Matsil. LLP

(57) ABSTRACT

In certain embodiments, a semiconductor device includes a substrate having an n-doped well feature and an epitaxial silicon germanium fin formed over the n-doped well feature. The epitaxial silicon germanium fin has a lower part and an upper part. The lower part has a lower germanium content than the upper part. A channel is formed from the epitaxial silicon germanium fin. A gate is formed over the epitaxial silicon germanium fin. A doped source-drain is formed proximate the channel.

20 Claims, 17 Drawing Sheets

(56) References Cited

U.S. PATENT DOCUMENTS

| | | | |
|---|---|---|---|
| 9,548,303 B2 | 1/2017 | Lee et al. | |
| 9,564,489 B2 | 2/2017 | Yeo et al. | |
| 9,576,814 B2 | 2/2017 | Wu et al. | |
| 9,601,342 B2 | 3/2017 | Lee et al. | |
| 9,608,116 B2 | 3/2017 | Ching et al. | |
| 2006/0186484 A1* | 8/2006 | Chau | H01L 29/785 257/401 |
| 2007/0131969 A1 | 6/2007 | Sanuki et al. | |
| 2009/0008705 A1 | 1/2009 | Zhu et al. | |
| 2009/0239344 A1* | 9/2009 | Jeong | H01L 21/268 438/197 |
| 2009/0280612 A1* | 11/2009 | Shimamune | H01L 29/045 438/300 |
| 2011/0031552 A1* | 2/2011 | Iwamatsu | H01L 27/1211 257/347 |
| 2011/0233679 A1* | 9/2011 | Chen | H01L 21/823431 257/368 |
| 2013/0011983 A1* | 1/2013 | Tsai | H01L 29/7848 438/285 |
| 2013/0011984 A1* | 1/2013 | Wang | H01L 29/66651 438/285 |
| 2013/0154016 A1* | 6/2013 | Glass | H01L 29/267 257/368 |
| 2013/0187237 A1* | 7/2013 | Yu | H01L 29/785 257/369 |
| 2014/0252475 A1 | 9/2014 | Xu | |
| 2015/0069458 A1* | 3/2015 | Li | H01L 29/7827 257/105 |
| 2015/0091099 A1 | 4/2015 | Ching et al. | |
| 2015/0162334 A1* | 6/2015 | Ho | H01L 29/7833 257/401 |
| 2017/0025509 A1* | 1/2017 | Cheng | H01L 29/41791 |
| 2017/0154990 A1 | 6/2017 | Sung et al. | |
| 2018/0122930 A1* | 5/2018 | Okamoto | H01L 27/0886 |

* cited by examiner

P-TYPE STRAINED CHANNEL IN A FIN FIELD EFFECT TRANSISTOR (FINFET) DEVICE

CROSS-REFERENCE TO RELATED APPLICATIONS

This application is a divisional of U.S. application Ser. No. 15/922,681 filed Mar. 15, 2018, which claims the benefit of U.S. Provisional Application 62/592,264 filed on Nov. 29, 2017, each application is hereby incorporated herein by reference.

BACKGROUND

As the semiconductor industry has progressed into nanometer technology process nodes in pursuit of higher device density and better performance, three-dimensional designs, such as fin field effect transistor (FinFET) devices, have been introduced into many semiconductor integrated circuit devices. One type of FinFET device is fabricated with multiple fin-like structures expanding vertically from a surface of a substrate. These fin-like structures are separated from each other by a shallow trench isolation (STI) region. Each of the fin-like structures has source/drain regions and channel regions formed between the source/drain regions. A metal gate is wrapped around the channel regions of each fin-like structure, allowing better control of current flow from three sides of the channel regions.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
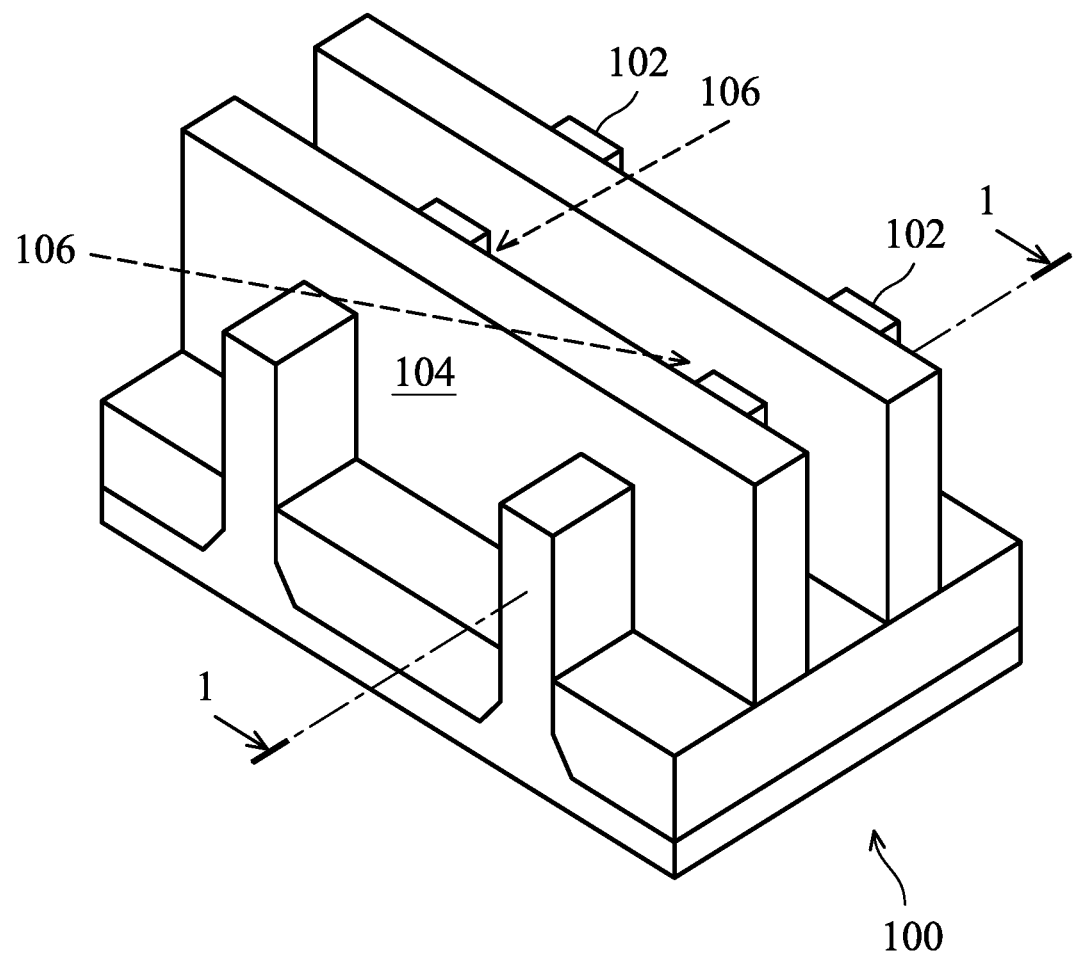
FIGS. 1A and 1B are schematic diagrams of perspective views and cross-sectional views of one stage of manufacturing a FinFET structure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 1B:
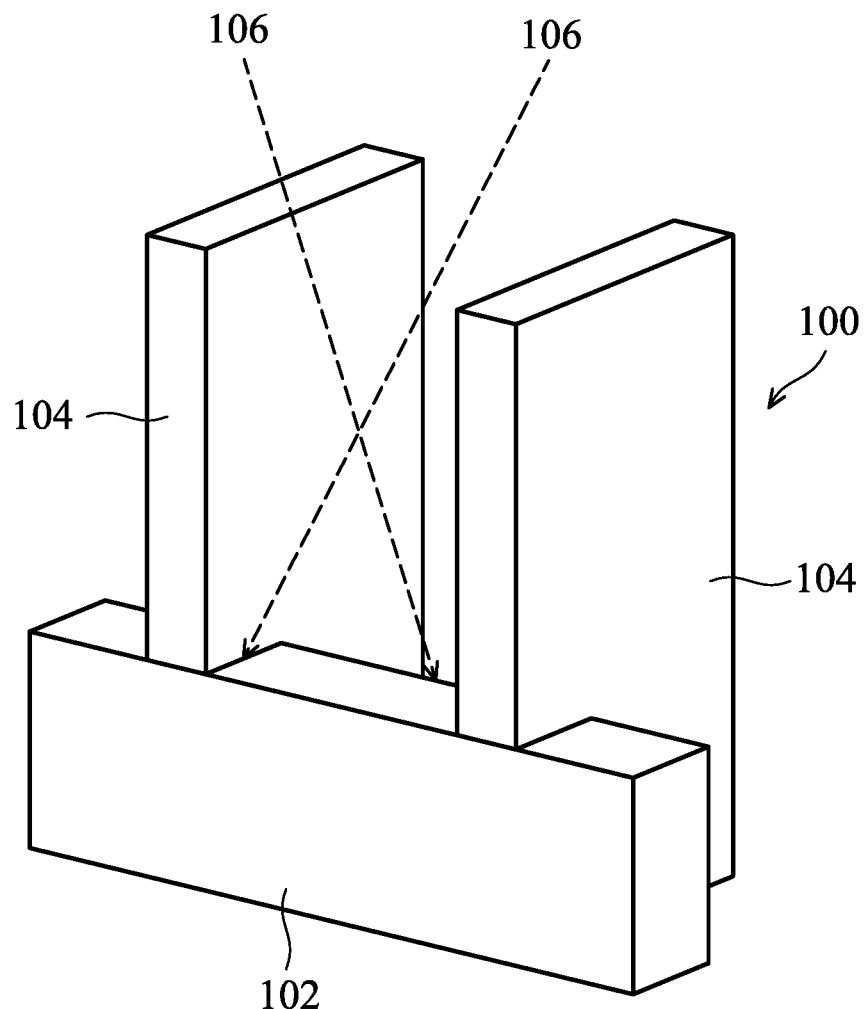

FIGS. 1A and 1B are schematic diagrams of perspective views and cross-sectional views of one stage of manufacturing a FinFET structure 100. The FinFET structure 100 includes two fins 102 and two gate structures 104 (including gate first structures and/or dummy gate structures) formed over the fins 102. The gate structures 104 covering portions of the fins 102 define transistor channels. One method of manufacturing p-type FinFET devices includes implanting p-type dopants, such as boron, into the fins 102 to form lightly doped source/drain (LDD) regions. As shown in FIG. 1B, which is a cross-sectional view in plane-1 of FIG. 1A through one of the fins 102 and gate structures 104, the gate structures 104 provide a shadowing effect 106 of the fins 102. Due to the shadowing effect 106 on the fin 102 by the gate structures 104, implanting of p-type dopants may result in poor dopant concentration levels at sides and the bottom of the fin, which can form poor LDD regions. For fins 102 composed of silicon germanium, the germanium content decreases diffusion of the p-type dopant, such as boron. For example, boron concentrations and depth of diffusion is less when the germanium content increases for silicon germanium fins. Poor doping levels at the sides and the bottom of the fin 102 may result in high source/drain resistance (Rsd). Conversely, implantation of dopants may cause too high of a concentration of dopants at the top of the fin 102. Too high of a concentration of dopants at the top of the fin 102 may result in significant diffusion of the dopant into the transistor channel, which may result in short channel effects (SCE). Implanting dopants to form LDD regions may also damage the gate structures 104 as well as other substrate features and layers.

Certain embodiments provide a FinFET structure comprising a fin comprising silicon geranium (SiGe). The channel formed by the SiGe fin has an increased dopant concentration in certain areas. For example, certain embodiments comprise a FinFET structure and a method of manufacturing a FinFET structure. The FinFET structure is manufactured with a controlled germanium content of the fins to increase the diffusion of dopants to the sides and the bottom of the fins which may be formed into lightly doped source/drain (LDD) regions.

Figure 2:
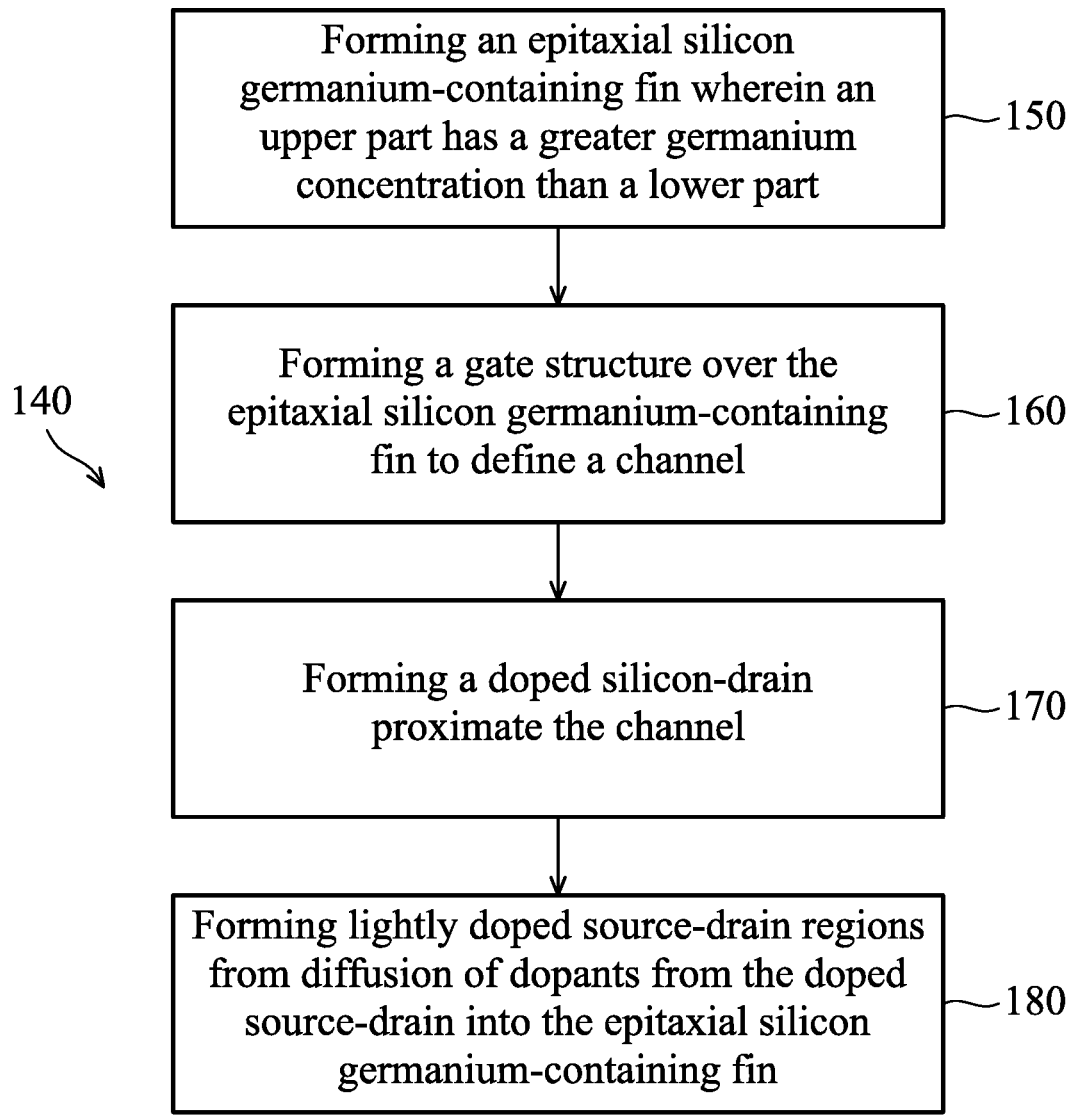
FIG. 2 is a flow diagram illustrating a method of manufacturing a semiconductor device in accordance with some embodiments.

FIG. 2 is a flow diagram illustrating a method 140 of manufacturing a semiconductor device, such as a FinFET structure, over a substrate, in accordance with some embodiments. The method 140 is described in reference to FIG. 3 to FIG. 8, which are schematic diagrams of various stages of manufacturing a semiconductor device, such as a FinFET device, over a substrate, in accordance with some embodiments. FIGS. 3A-3D are cross-sectional views of a substrate 202, in accordance with some embodiments. The substrate 202 may be a semiconductor wafer, such as a silicon wafer. Alternatively or additionally, the substrate 202 may include elementary semiconductor materials, compound semiconductor materials, and/or alloy semiconductor materials. Examples of elementary semiconductor materials may include, but are not limited to, silicon and germanium, which may be monocrystalline or may be polycrystalline, for example. Examples of compound semiconductor materials include, but are not limited to, silicon carbide, gallium arsenic, gallium phosphide, indium phosphide, indium arsenide, and/or indium antimonide. Examples of alloy semiconductor materials include, but are not limited to, SiGe, GaAsP, AlInAs, AlGaAs, GaInAs, GaInP, and/or GaInAsP.

The substrate 202 may be doped with n-type dopants to form a n-well 204 for p-type field effect transistors (PFETs) and p-type dopants to form a p-well 205 for n-type field effect transistors (NFETs). For example, the substrate 202 may be implanted with an n-type dopant through an opening in a developed first photoresist that masks the substrate 202 to form the n-well 204, and may be implanted with a p-type dopant through an opening in a developed second photoresist that masks the substrate 202 to form the p-well 205. A concentration of the n-type dopant in the n-well 204 can be in a range from about $5 \times 10^{16}$ cm$^{-3}$ to about $1 \times 10^{19}$ cm$^{-3}$, and a concentration of the p-type dopant in the p-well 205 can be in a range from about $5 \times 10^{16}$ cm$^{-3}$ to about $1 \times 10^{19}$ cm$^{-3}$.

An epitaxial silicon layer 206 may be deposited over the substrate 202 (e.g., on the n-well 204 and p-well 205 in the substrate 202). The epitaxial silicon layer 206 may be deposited by chemical vapor deposition (CVD), low pressure CVD (LPCVD), atomic layer CVD (ALCVD), ultrahigh vacuum CVD (UHVCVD), reduced pressure CVD (RPCVD), vapor-phase epitaxy (VPE), molecular beam epitaxy (MBE), any other suitable deposition processes, or any combination thereof. The epitaxial silicon layer 206 may be intrinsic silicon (e.g., undoped silicon), in some examples.

A mask layer 207, such as a silicon oxide layer, may be formed on the epitaxial silicon layer 206. The mask layer 207 may be formed by an oxidation process, such as oxidation of the epitaxial silicon layer 206, and/or by a deposition process such as a chemical vapor deposition (CVD), physical vapor deposition (PVD), spin-on coating, or the like.

The epitaxial silicon layer 206 over the n-well 204 is thinned or removed. In the illustrated example, the epitaxial silicon layer 206 over the n-well 204 is thinned to form thinned epitaxial silicon layer 206E. To thin or remove a portion of the epitaxial silicon layer 206, a photolithography and etching process may be performed to pattern the mask layer 207 such that the mask layer 207 remains over the epitaxial silicon layer 206 over the p-well 205 but exposes the epitaxial silicon layer 206 over the n-well. Using the patterned mask layer 207, the epitaxial silicon layer 206 may be etched to thin or remove the epitaxial silicon layer 206 over the n-well 204. The etching process may be a timed or controlled etch and may be a reactive ion etch (RIE), neutral beam etch, or another appropriate etching process. If the epitaxial silicon layer 206 over the n-well 204 is thinned, as opposed to completely removed, a thickness of the thinned epitaxial silicon layer 206E may be in a range from about 2 nm to about 20 nm.

Figure 3A:
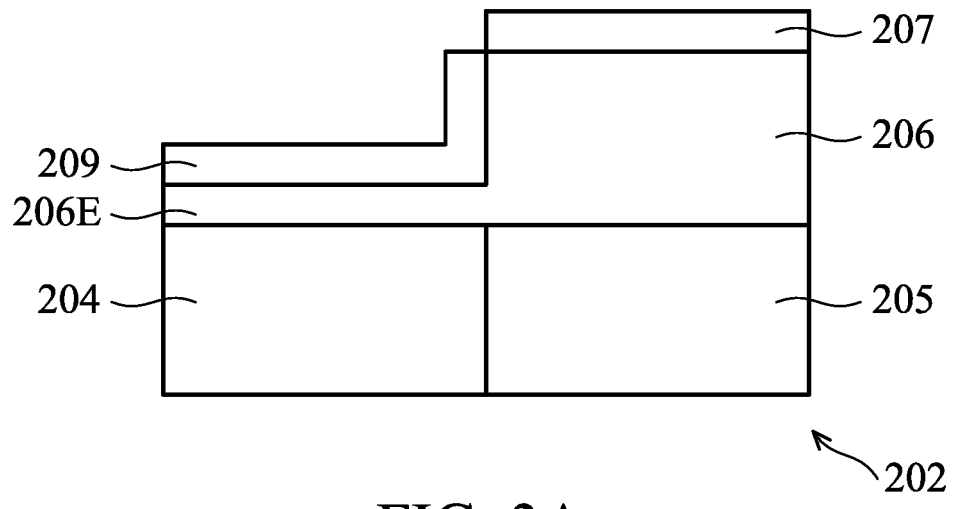
FIGS. 3A-3D are cross-sectional views of a substrate with an n-well and a p-well, in accordance with some embodiments.
Figure 3B:
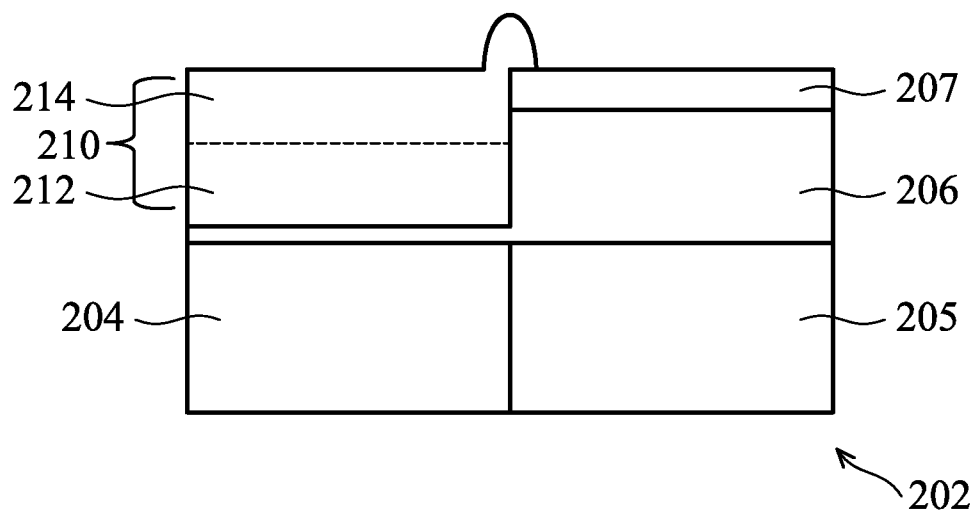

At block 150 of the method 140, a semiconductor alloy film 210 may be deposited by selective epitaxial growth over the thinned epitaxial silicon layer 206E, which is exposed through the patterned mask layer 207, as shown in FIG. 3B. The semiconductor alloy film 210 has a content of an element that varies by depth. An example of a semiconductor alloy film 210 is a silicon germanium ($Si_xGe_{x-1}$) film. Deposition methods include chemical vapor deposition (CVD), low pressure CVD (LPCVD), atomic layer CVD (ALCVD), ultrahigh vacuum CVD (UHVCVD), reduced pressure CVD (RPCVD), vapor-phase epitaxy (VPE), molecular beam epitaxy (MBE), any other suitable deposition processes, or any combination thereof.

For example, in one embodiment, a selective epitaxial growth process may include in-situ epitaxial deposition and in-situ partial etch processes to assist in selective epitaxial growth over crystalline surfaces while reducing growth on non-crystalline surfaces and to reduce crystal defects of the grown epitaxial films. For example, the partial etching process may use an etching gas, such as hydrogen chloride (HCl), chlorine (Cl$_2$), other suitable etching gases, and/or any combinations thereof. The partial etching process removes amorphous deposited material over non-crystalline surfaces at a rate higher than the removal rate of epitaxial material. Therefore, an epitaxial film may primarily remain on a surface of the thinned epitaxial silicon layer 206E.

One example of a SiGe epitaxial growth process includes performing an epitaxial growth process at a temperature in a range from about 500° C. to about 800° C. In another example, an epitaxial growth process may be performed at a pressure in a range from about 1 Torr to about 100 Torr. Processing gases may include HCl, SiH$_2$Cl$_2$ (dichlorosilane), SiH$_4$ (silane), GeH$_4$ (germane), H$_2$, or N$_2$, carrier gas, other silicon precursors, other germanium precursors, other etching gases, other carrier gases, and combinations thereof.

In certain embodiments, a seed layer 209 is deposited over the thinned epitaxial silicon layer 206E to assist in formation of the semiconductor alloy film 210. For semiconductor alloy film 210 comprising SiGe, the seed layer 209 may comprise Si, SiGeC, SiGe, or other suitable materials. Seed layer 209 may be deposited by chemical vapor deposition (CVD), physical vapor deposition (PVD), epitaxial growth processes, any other suitable deposition processes, or any combination thereof. In certain embodiments, a SiGe epitaxial growth process includes a baking process, depositing the seed layer 209, and growing the SiGe semiconductor alloy film 210 over the seed layer 209. The baking process, deposition of the seed layer 209, and growth of the SiGe semiconductor alloy film 210 may be conducted at the same or different process temperatures.

In other embodiments, a semiconductor alloy film 210 is formed directly over the thinned epitaxial silicon layer 206E without a seed layer. In certain embodiments, the seed layer is conducted in a similar deposition method as growth of the semiconductor alloy film 210.

In certain embodiments, the semiconductor alloy film 210 is formed by growing a lower part 212 and an upper part 214 over the thinned epitaxial silicon layer 206E over the n-well 204. The lower part 212 of the semiconductor alloy film 210 is grown proximate to the n-well 204 and the upper part 214 of the semiconductor alloy film 210 is grown over the lower part 212.

In certain embodiments in which the semiconductor alloy film 210 comprises SiGe, the lower part 212 of the semiconductor alloy film 210 has a lower atomic percent content (atomic percent content herein referred to as "content") of germanium than the upper part 214 of the semiconductor alloy film 210 comprising SiGe. The lower content of germanium of the lower part 212 of the semiconductor alloy film 210 may increase diffusion of dopants to the lower part 212 of the SiGe semiconductor alloy film 210. In certain embodiments, a higher content of germanium of the upper part 214 of the SiGe semiconductor alloy film 210 can provide a higher stress at the top of a channel to be formed from the SiGe semiconductor alloy film 210. In certain embodiments, the lower part 212 of the semiconductor alloy film 210 has a germanium content in a range from 10% to 30%, such as a range from 15% to 25%. In certain embodiments, the upper part 214 of the semiconductor alloy film 210 has a germanium content in a range from 20% to 40%. The germanium content of the lower part 212 and the upper 214 can increase the electron mobility of a channel defined by a gate structure. The lower germanium content of the lower part 212 in comparison to the upper part 214 of the semiconductor alloy film 210 can help to increase dopant concentration in the lower part 212 from implantation and/or from diffusion of dopants from a doped source/drain. In certain embodiments, the lower part 212 of the semiconductor alloy film 210 may have an increasing gradient of germanium content from a bottom of the lower part 212 to a top of the lower part 212 of the semiconductor alloy film 210. In certain embodiments, the increasing gradient may be a gradual profile. For example, the gradual profile of the increasing gradient may comprise small increases of about 0.5% or less of germanium content. In certain embodiments, the increasing gradient may be a stepped profile. For example, the stepped profile of the increasing gradient may comprise large increases in one or more steps of 5% or more germanium content. In some examples, the content of germanium increases from about 15% at the bottom of the lower part 212 to about 25% at the top of the lower part 212. In certain embodiments, the upper part 214 of the semiconductor alloy film 210 has a uniform or substantially uniform germanium content (such as a germanium content that varies ±2%), which may enhance the strain characteristics of a channel formed from the semiconductor alloy film 210. In some examples, the uniform concentration of germanium of the upper part 214 is about 25%±2%.

The lower part 212 and the upper part 214 of the semiconductor alloy film 210 may be grown to a desired thickness. In some embodiments where seed layer 209 is below lower part 212 and upper part 212, the thickness of the seed layer 209 (H3), the thickness of the lower part 212 (H2), and the thickness of the upper part 214 (H1) define a fin height (H1+H2+H3). In certain embodiments, the thickness of the lower part 212 (H2) and the thickness of the upper part 214 (H1) are formed such that H2>H1. In other words, in the final semiconductor device structure, the lower part 212 has a greater height thickness than the upper part 214 which may increase the dopant concentration and dopant diffusion into the lower part 212 of the semiconductor alloy film 210. For example, in the final semiconductor device structure, the lower part 212 may have a height thickness in a range from about 30 nm to about 60 nm and the upper part 214 may have a height thickness in a range from about 20 nm to about 50 nm. In another embodiment, a ratio of the height thickness of the lower part 212 to the height thickness of the upper part 214 can be in a range from about 1:1 to about 10:1. A ratio of the lower part 212 to the height thickness of the upper part 214 of 1:1 or more provides the upper part 214 of a fin with a germanium content so that an electron mobility for a channel defined by a gate structure can be increased. A ratio of the lower part 212 to the height thickness of the upper part 214 of 10:1 or less provides a fin with a germanium content with increased dopant concentration from implantation/diffusion to provide lower contact resistance between the lower part 212 of a fin and source-drain regions.

Epitaxial growth of the semiconductor alloy film 210 with a lower part 212 having a lower germanium content than an upper part 214 may be formed by changing a deposition parameter selected from the group consisting of a substrate heater temperature, a deposition pressure, and a gas flow ratio of a germanium precursor to a silicon precursor.

In certain embodiments, the lower part 212 of the SiGe semiconductor alloy film 210 may be formed at a first deposition temperature in a range from about 600° C. to about 750° C. and the upper part 214 of the SiGe semiconductor alloy film 210 may be formed at a second deposition temperature in a range from about 550° C. to about 650° C. For example, the lower part 212 of the SiGe semiconductor alloy film may be deposited at an initial temperature of about 700° C. and ramped down gradually or in steps to a final temperature of about 600° C., and the upper part 214 of the SiGe semiconductor alloy film may be deposited at a constant temperature of about 600° C.

In another embodiment, the lower part 212 of the SiGe semiconductor alloy film 210 may be formed at a first ratio of precursor gas to etching gas and the upper part 214 of the SiGe semiconductor alloy film 210 may by formed at a second ratio of precursor gas to etching gas. For example, the lower part 212 of the SiGe semiconductor alloy film may be formed at a ratio of germanium precursor to germanium precursor and etching gas (such $GeH_4/(GeH_4+HCl)$) in a range from about 0.9 to about 1.0, and the upper part 214 of the SiGe semiconductor alloy film may be formed at a ratio of germanium precursor to germanium precursor and etching gas (such $GeH_4/(GeH_4+HCl)$) in a range from about 0.6 to about 0.8. In another example, the lower part 212 of the SiGe semiconductor alloy film may be formed at a first ratio of silicon precursor to silicon precursor and etching gas ratio (such $SiH_4/(SiH_4+Cl_2H_2Si)$) in a range from about 0.9 to about 1.0, and the upper part 214 of the SiGe semiconductor alloy film may be formed at a second ratio of silicon precursor to silicon precursor and etching gas ratio (such $SiH_4/(SiH_4+Cl_2H_2Si)$) in a range from about 0.2 to about 0.6.

Embodiments of epitaxial growth of the semiconductor alloy film 210 with a lower part 212 having a lower germanium content than an upper part 214 may be formed by changing one or more deposition parameters and by keeping one or more deposition parameters the same. For example, the substrate temperature may be the same while the precursor gas to etching gas ratios are changed during growth of the lower part 212. In another example, the substrate temperature may be changed while the precursor gas to etching gas ratios are also changed during growth of the lower part 212.

Figure 3C:
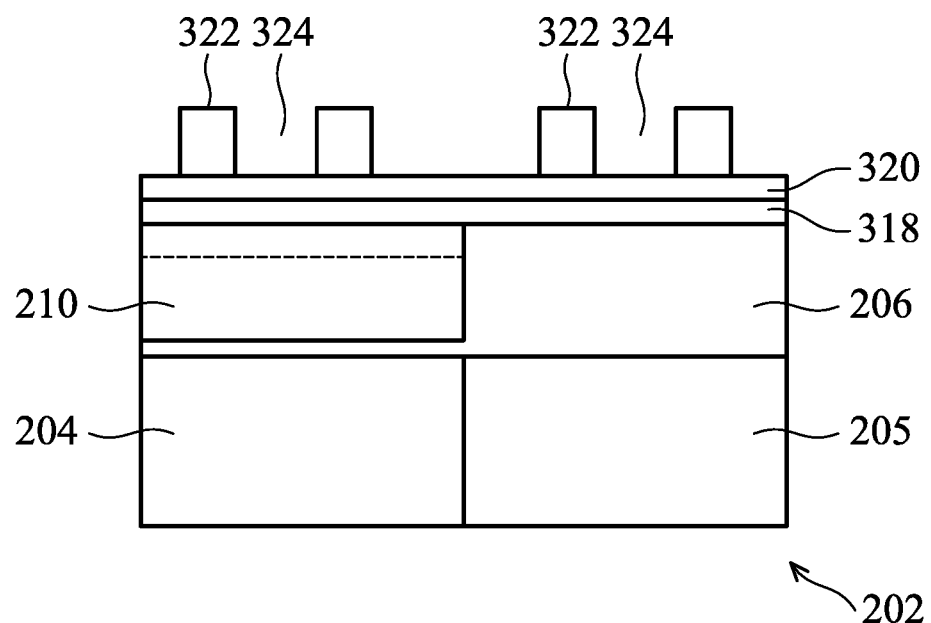

In FIG. 3C, the substrate 202 may be planarized, such as by a chemical mechanical polishing (CMP) process. The planarization process can remove the patterned mask layer 207 of FIG. 3B and smooth the top surface of the semiconductor alloy film 210 and the epitaxial silicon layer 206.

A capping layer 318, such as a silicon layer, may be deposited over the planarized substrate. For example, the capping layer 318 can be epitaxially grown using chemical vapor deposition (CVD), low pressure CVD (LPCVD), atomic layer CVD (ALCVD), ultrahigh vacuum CVD (UHVCVD), reduced pressure CVD (RPCVD), vapor-phase epitaxy (VPE), molecular beam epitaxy (MBE), any other suitable deposition processes, or any combination thereof.

An interface layer 320, such as a silicon oxide, may be formed over and/or by consuming at least a portion of the capping layer 318. For example, an interface layer 320 of silicon oxide may be formed through oxidizing at least a portion of the capping layer 318. A mask layer 322, such as a silicon nitride layer, may be deposited over the interface layer 320. The interface layer 320 may be used as an adhesion layer between the capping layer 318 and the mask layer 322. The mask layer 322 may be used as a hard mask during subsequent etching processes. The mask layer 322 may be formed by using low-pressure chemical vapor deposition (LPCVD), plasma enhanced chemical vapor deposition (PECVD), or other deposition processes. The mask layer 322 is patterned to form openings 324 using appropriate photolithography and etching processes.

Figure 3D:
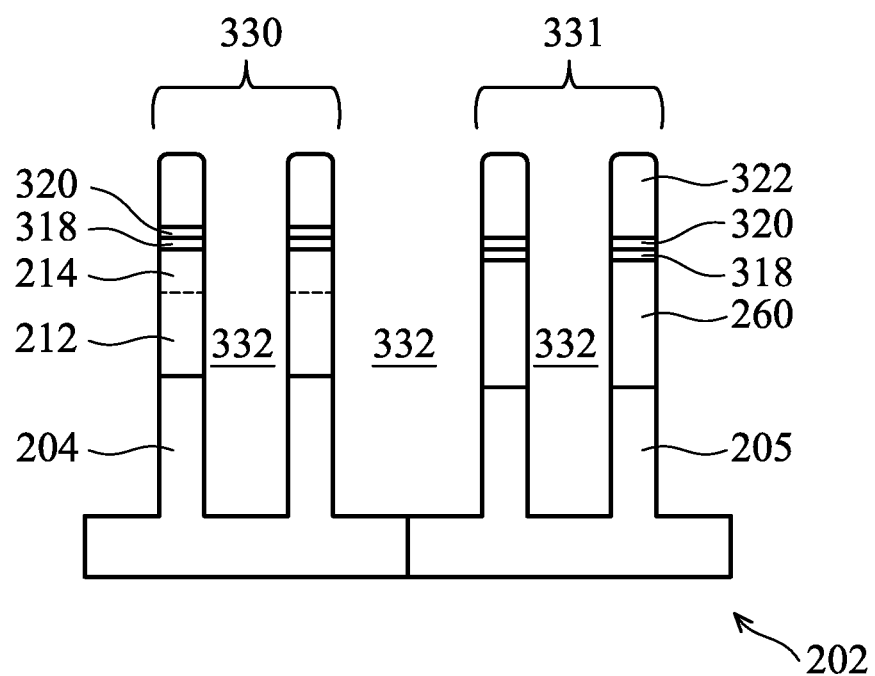

In FIG. 3D, the substrate 202 is etched through the openings 324 of the mask layer 322 to form silicon germanium (SiGe)-containing fins 330 from the semiconductor alloy film 210 comprising SiGe and to form silicon (Si) fins 331 from the epitaxial silicon layer 206. The SiGe-containing fins 330 and the Si fins 331 may be formed by etching trenches 332 through the mask layer 322, the interface layer 320, the semiconductor alloy film 210, the epitaxial silicon layer 206, a portion of the n-well 204, and a portion of the p-well 205. Etching trenches 332 to form SiGe-containing fins 330 and Si fins 331 may be performed by dry etching (such as plasma etching, reactive ion etching, etc.), and other etching methods. For example, dry etching may comprise a plasma etch using a processing gas, including but not limited to, tetrafluoromethane ($CF_4$), chlorine gas ($Cl_2$), nitrogen trifluoride ($NF_3$), sulfur hexafluoride ($SF_6$), and/or helium (He).

Two SiGe-containing fins 330 to form PFET devices and two Si fins 331 to form NFET devices are shown in FIG. 3D although any number of fins may be formed and adjusted according to a desired application. Although not shown, in some embodiments, the SiGe-containing fins 330 and the Si fins 331 may have a width that increases from the bottom of the fin to the top of the fin. In other embodiments, the fins formed over the p-well 205 may be SiC fins or fins of other suitable materials to form NFET devices.

Figure 9:
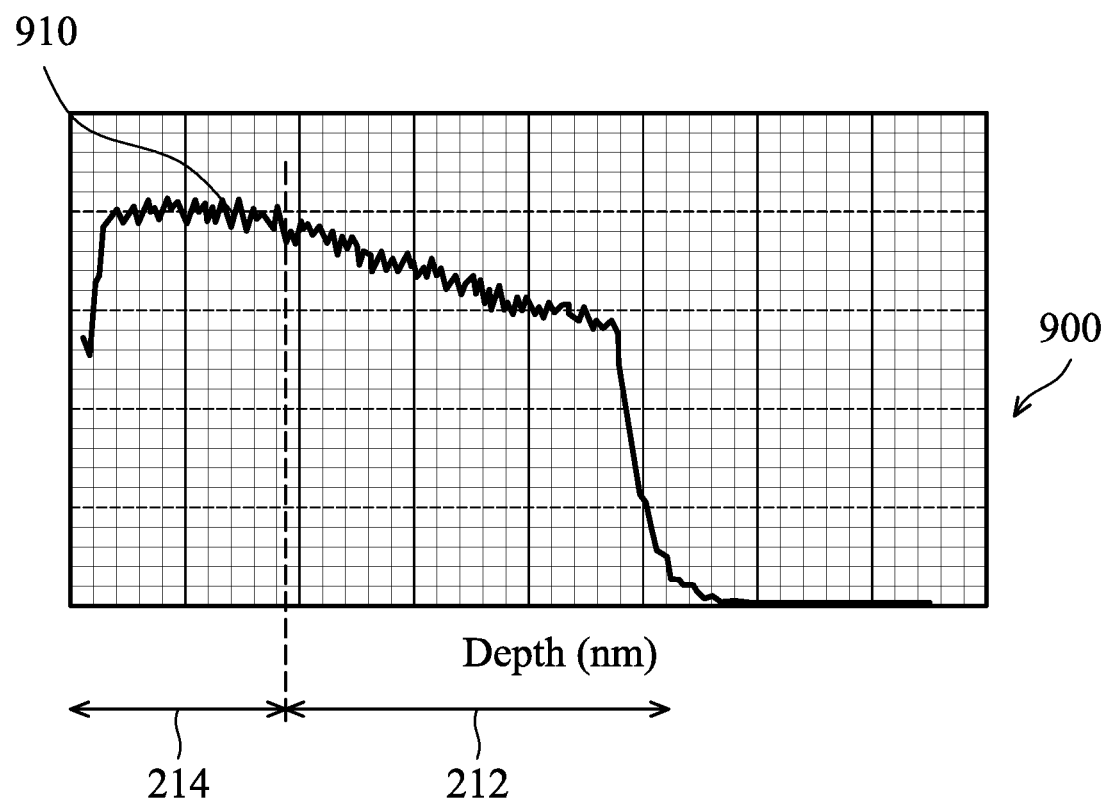
FIG. 9 is a graph of a germanium content in a SiGe-containing fin, in accordance with some embodiments.
Figure 10:
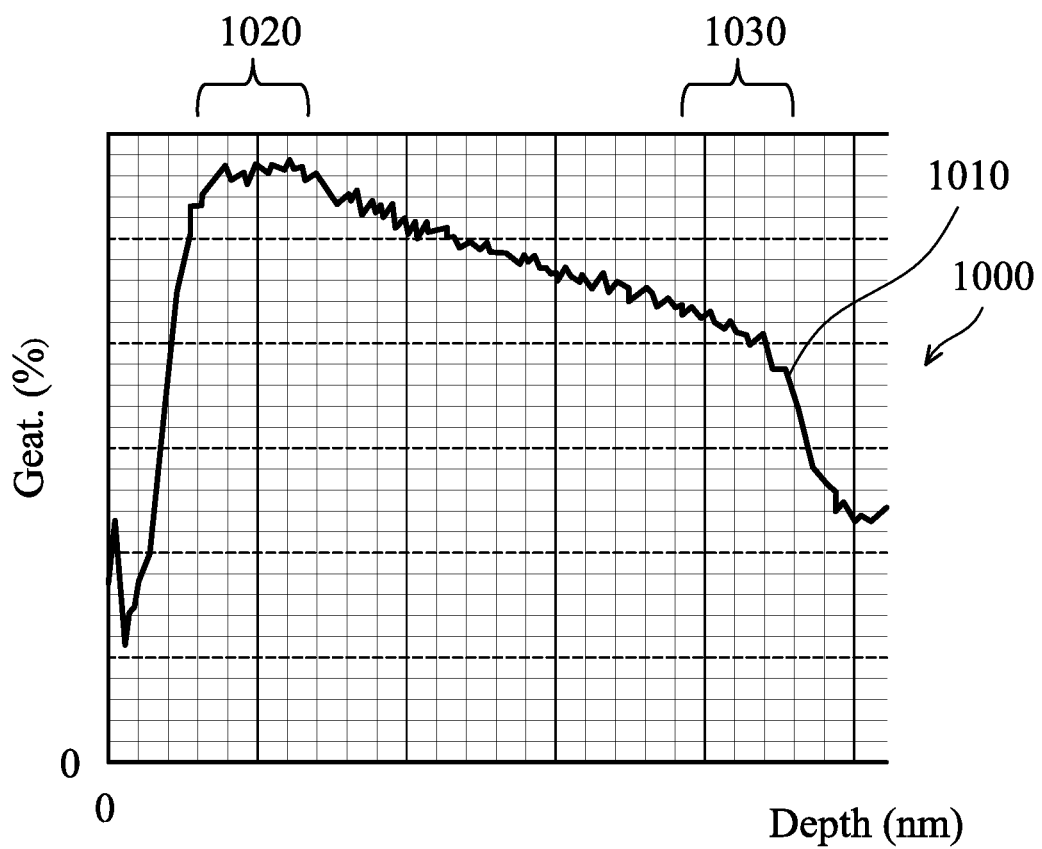
FIG. 10 is a graph of a germanium content in a SiGe source/drain, in accordance with some embodiments.

FIG. 9 is a graph 900 of a germanium content in a SiGe-containing fin 330, in accordance with some embodiments. Line 910 is the atomic percent content of germanium in the SiGe-containing fin 330 starting at depth 0 (top of the SiGe-containing fin 330). As shown in the graph 900, in at least on embodiment, the germanium content is about 25% from a thickness of the upper part 214 of the SiGe-containing fin 330. The germanium content is a smooth gradient from about 25% geranium content to about 15% germanium content from a top of the lower part 212 to the bottom of the lower part 212 of the SiGe-containing fin 330.

Figure 4A:
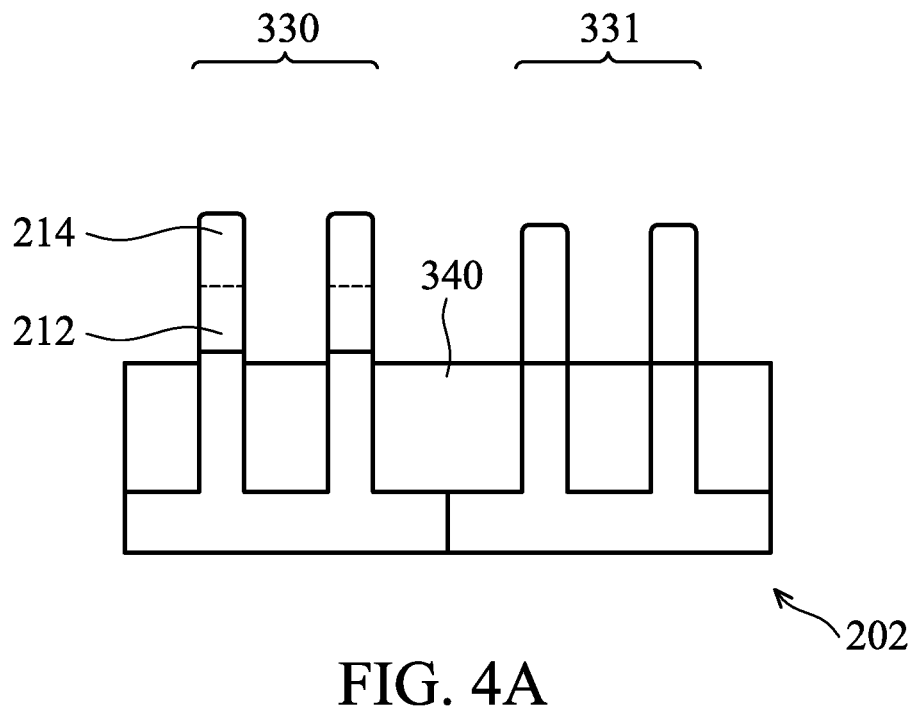
FIGS. 4A-4C are cross-sectional views of a substrate having SiGe-containing fins and having Si fins, in accordance with some embodiments.
Figure 4B:
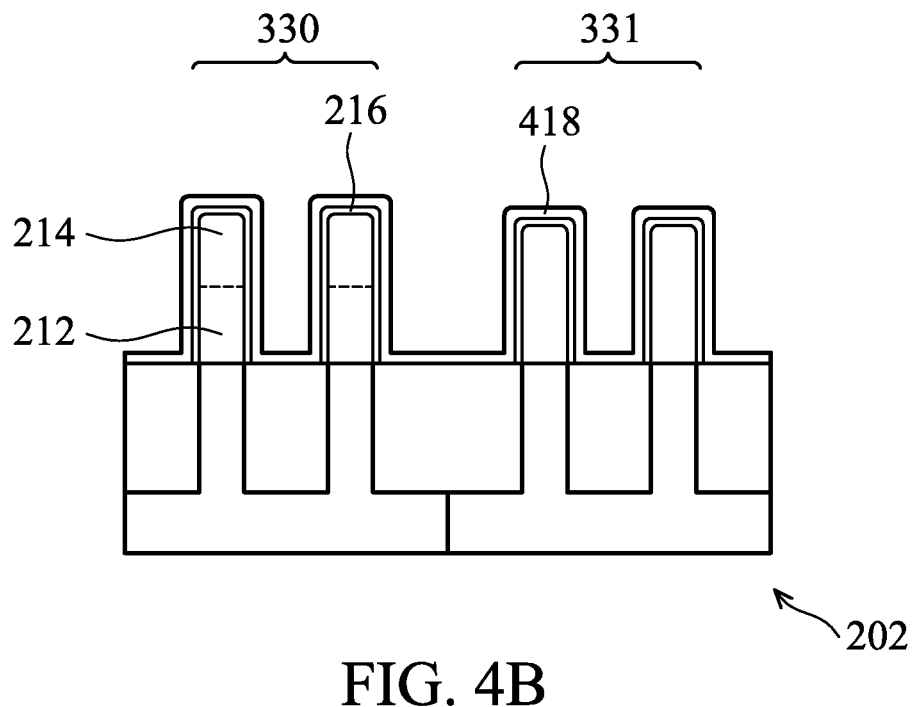
Figure 4C:
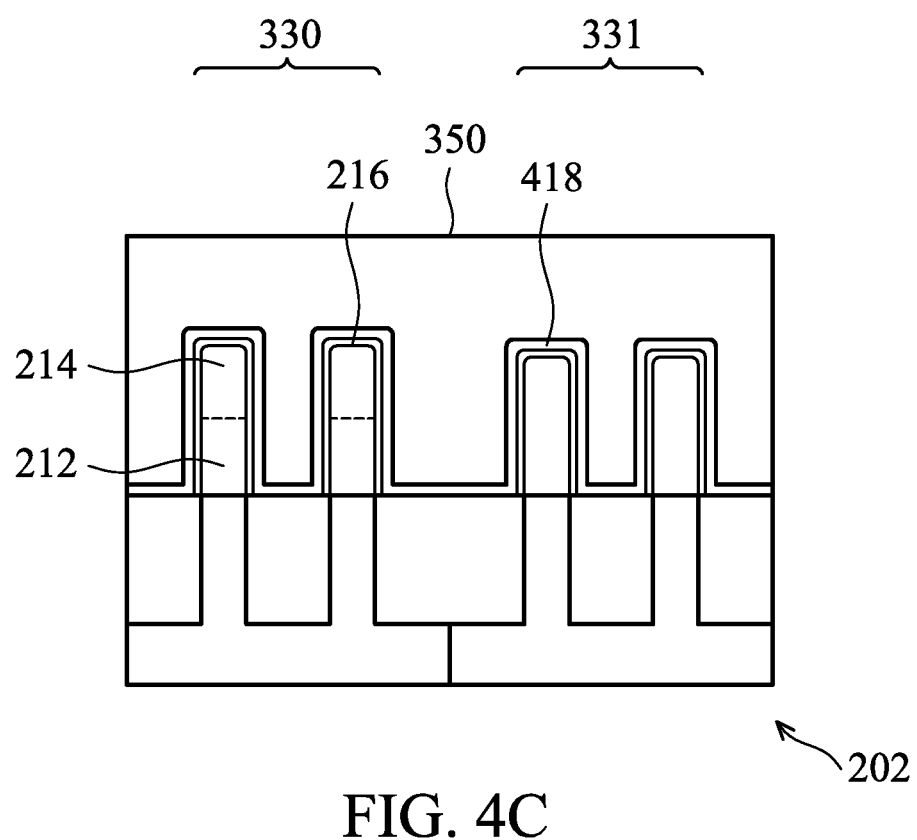

At block 160 of the method 140, a gate structure, such as a gate first structure or a dummy gate structure, may be formed over the SiGe-containing fins 330 and the Si fins 331 to define channels as shown in FIG. 4. FIGS. 4A-C are cross-sectional views of the substrate 202 having SiGe-containing fins 330 and having Si fins 331, in accordance with some embodiments. In FIG. 4A, the mask layer 322 may be removed. An insulating material 340 may be formed to fill the trenches 332 between the SiGe-containing fins 330 and the Si fins 331. The insulating material 340 may form shallow trench isolation (STI) structures. The insulating material 340 may be made of silicon oxide, silicon nitride, silicon oxynitride, phospho-silicate glass (PSG), boro-silicate glass (BSG), boron-doped phospho-silicate glass (BPSG), other dielectric layers, or multiple layers thereof. For example, the insulating material 340 may comprise a silicon nitride liner and a silicon oxide deposited over the silicon nitride liner.

The insulating material 340 may be formed using, flowable CVD, high-density plasma (HDP), sub-atmospheric pressure chemical vapor deposition (SACVD), low-pressure chemical vapor deposition (LPCVD), atomic layer deposition (ALD), plasma enhanced ALD (PEALD), plasma enhanced CVD (PECVD), monolayer deposition (MLD), plasma impulse CVD (PICVD), or other deposition processes. The insulating material 340 may be etched to cause respective portions of the SiGe-containing fins 330 and Si fins 331 to protrude from neighboring insulating material 340. For example, the upper part 214 and at least a portion of the lower part 212 of the SiGe-containing fins 330 are exposed. Etching of the insulating material 340 may be performed by dry etching (such as plasma etching, reactive ion etching, etc.), wet etching, and other etching methods. In some embodiments, a portion of the SiGe-containing fin 330 comprising the n-well is surrounded by the insulating material 340, and a portion of the SiGe-containing fin 330 comprising the semiconductor alloy film 210 protrudes from the insulating material 340. The insulating material 340 forms isolation structures, which may prevent electrical interference or crosstalk between different fins or between different FinFET devices.

In FIG. 4B, a liner 216, such as a silicon liner, may be deposited over the exposed SiGe-containing fins 330 to control Ge out diffusion from the SiGe-containing fins 330. For example, a silicon liner may be deposited to a thickness in a range from about 0.5 nm to about 5 nm. The liner 216 may be formed by selective epitaxial growth over the SiGe-containing fins 330. Deposition methods include chemical vapor deposition (CVD), low pressure CVD (LPCVD), atomic layer CVD (ALCVD), ultrahigh vacuum CVD (UHVCVD), reduced pressure CVD (RPCVD), vapor-phase epitaxy (VPE), molecular beam epitaxy (MBE), any other suitable deposition processes, or any combinations thereof.

A dielectric layer 418 may be deposited over the liner 216 or directly on the fins 330, 331 if no liner is used. The dielectric layer 218 may comprise silicon oxide, silicon nitride, a high-k dielectric material (e.g., if used in a gate first process), the like, or multilayers thereof. A high-k dielectric material may have a k value greater than about 7.0, and may include a metal oxide of or a metal silicate of hafnium (Hf), aluminum (Al), zirconium (Zr), lanthanum (La), magnesium (Mg), barium (Ba), titanium (Ti), lead (Pb), multilayers thereof, or a combination thereof. The dielectric layer may be deposited by plasma-enhanced CVD (PECVD), ALD, molecular-beam deposition (MBD), or another conformal deposition process.

In FIG. 4C, a dummy gate stack 350 may be formed over the dielectric layer 418. The dummy gate stack 350 may include one or more dummy films (e.g., a polysilicon film) formed by a deposition process, such as chemical vapor deposition (CVD), physical vapor deposition (PVD), atomic layer deposition (ALD), high density plasma CVD (HDPCVD), metal organic CVD (MOCVD), or plasma enhanced CVD (PECVD).

Figure 5A:
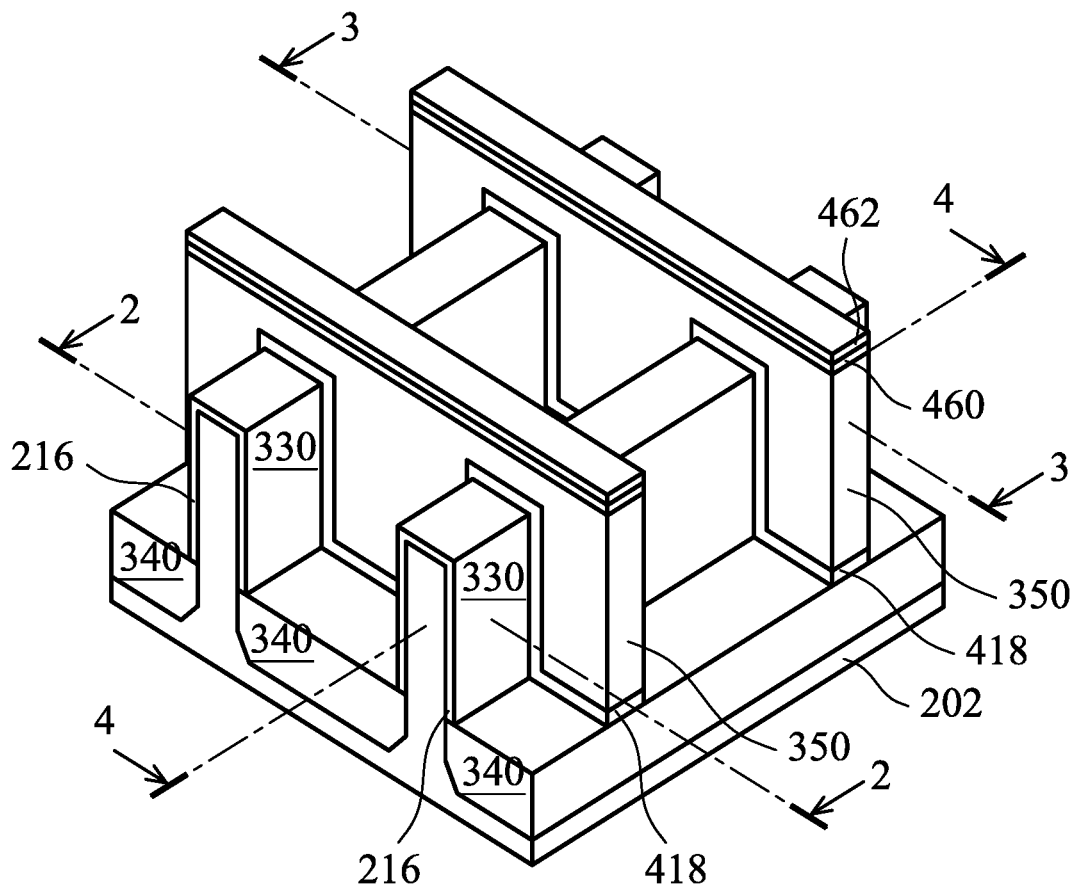
FIGS. 5A-5D are various views of a substrate having SiGe-containing fins with a dummy gate stack formed over the SiGe-containing fins, in accordance with some embodiments.

FIGS. 5A-D are various views of the substrate 202 having SiGe-containing fins 330 with a dummy gate stack 350 formed over the SiGe-containing fins 330, in accordance with some embodiments. For clarity purposes, the substrate 202 will be described in reference to various stages of manufacturing of the SiGe-containing fins 330. It is understood that similar processes may be performed on the Si fins 331 to form NFET devices. In FIG. 5A, a first hard mask layer 460 and a second hard mask layer 462 are formed over the dummy gate stack 350. A photoresist layer is formed over the second hard mask layer 462 and is patterned to form a patterned photoresist layer (not shown). Portions of the dummy gate stack 350 are removed, such as by a dry etching process, to form a dummy gate structure 360 as shown in FIG. 5A.

Figure 5B:
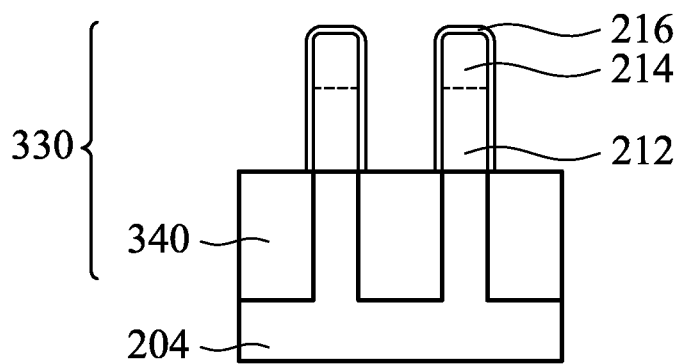
Figure 5C:
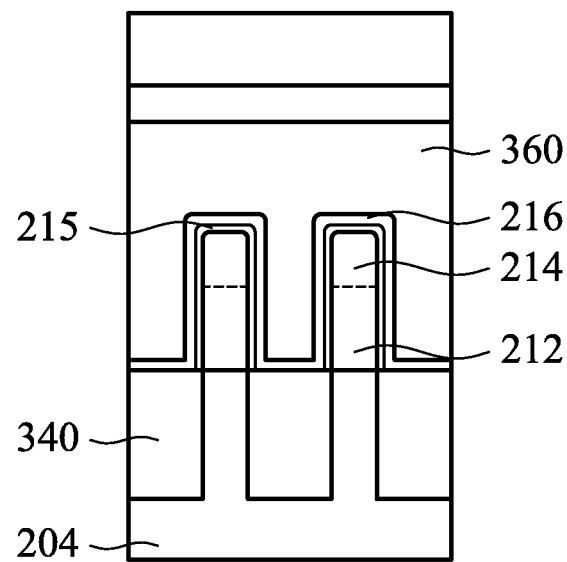
Figure 5D:
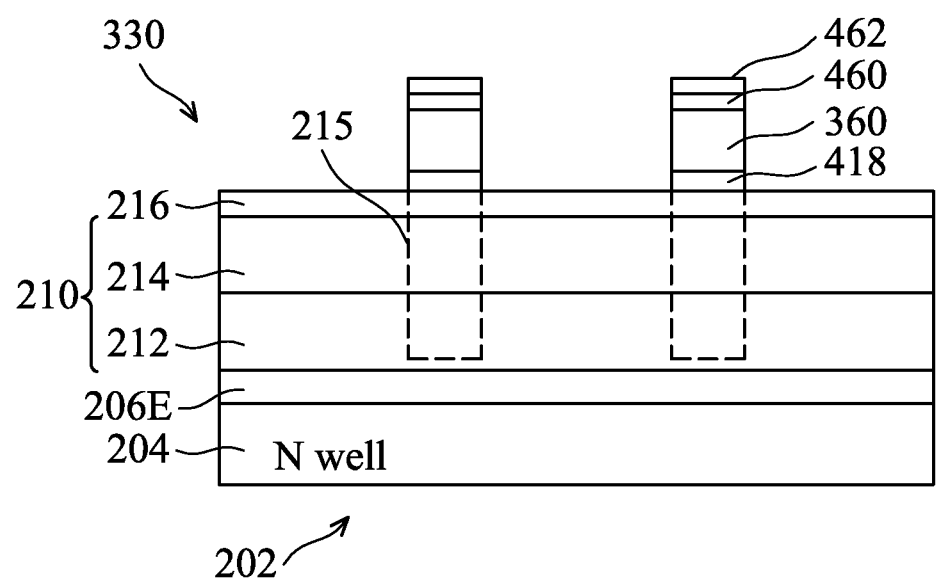

Portions of the dummy gate stack 350 and portions of the dielectric layer 418 are also removed to expose portions of the SiGe-containing fins 330. In some embodiments, the liner 216 is also exposed. FIG. 5B is a cross-sectional view in a plane-2 across the exposed SiGe-containing fins 330 and exposed liner 216 of FIG. 5A. FIG. 5C is cross-sectional view in a plane-3 across the dummy gate structure 360 and channels 215 formed by the SiGe-containing fins 330 and liner 216 of FIG. 5A. The channels 215 include portions of the lower part 212 and the upper part 214 of the semiconductor alloy film 210 that has been formed into SiGe-containing fins 330 and the liner 216 that underlies the dummy gate stack 350. The channels 215 are defined by the area covered by the dummy gate structure 360. FIG. 5D is cross-sectional view in a plane-4 of FIG. 5A through the exposed SiGe-containing fins 330 and the dummy gate structure 360. In this view, channels 215 include portions of the upper part 214 of the semiconductor alloy film 210 and the liner 216

Figure 6A:
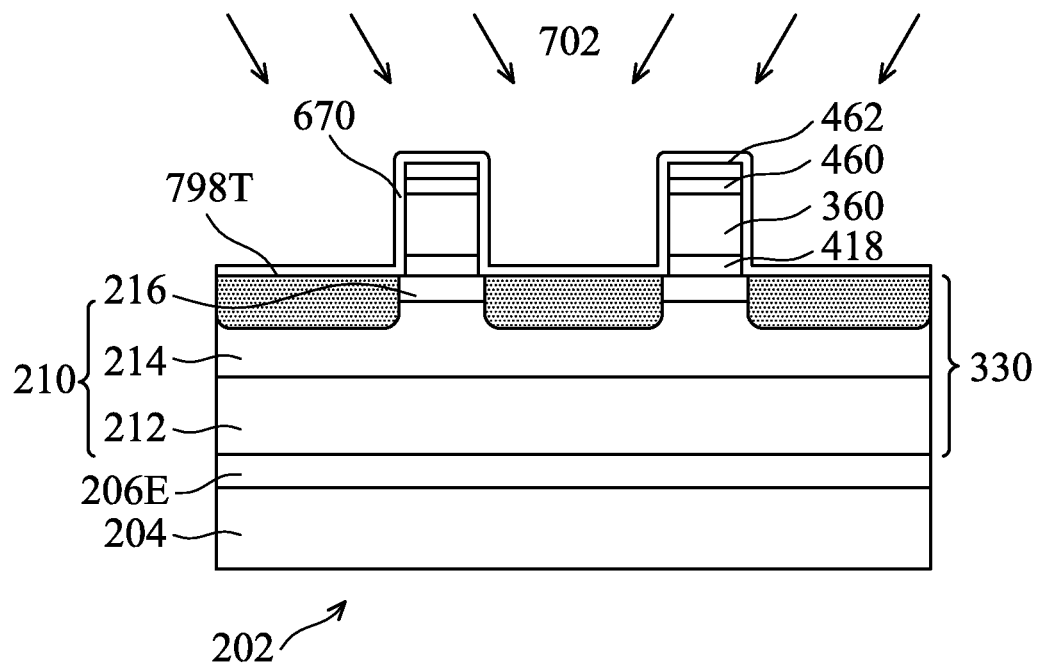
FIGS. 6A-6C are cross-sectional views through the exposed SiGe fins and the dummy gate structure, in accordance with some embodiments.
Figure 6B:
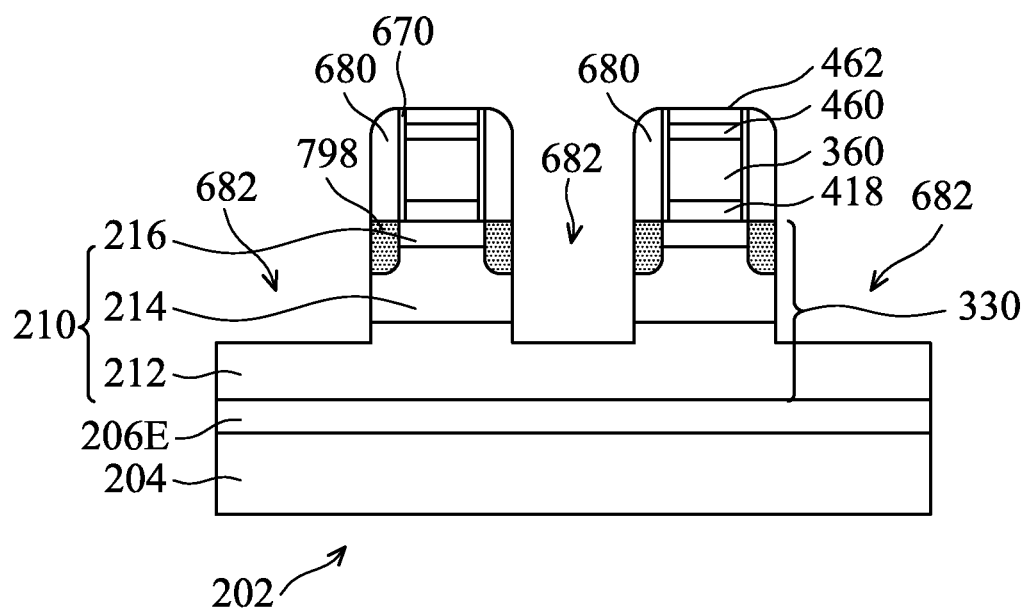
Figure 6C:
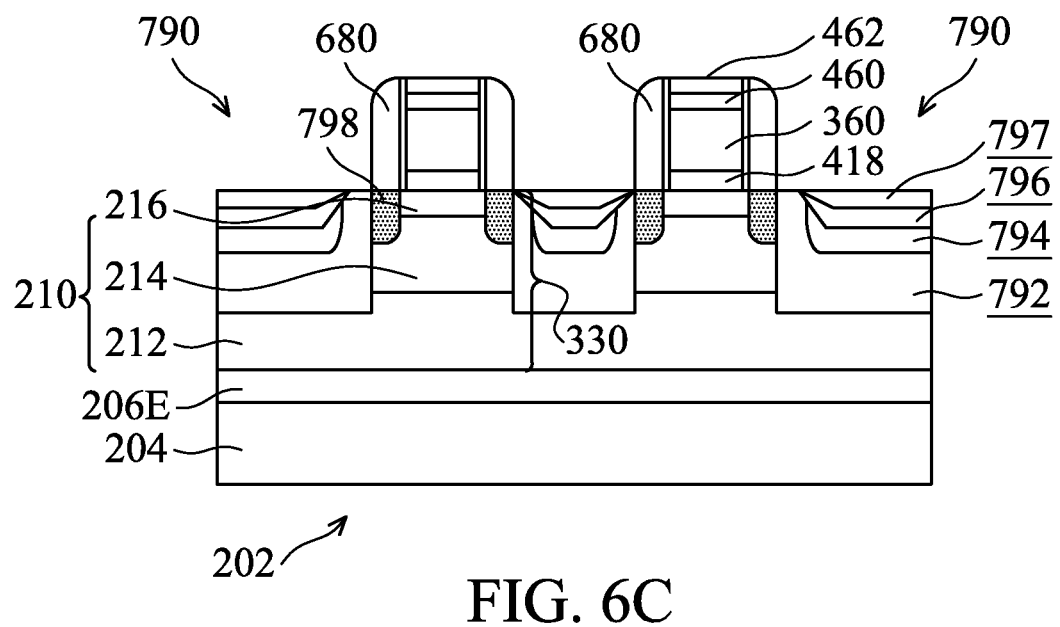

At block 170 of the method 140, a doped source/drain may be formed proximate to the channels 215 as shown in FIGS. 6A-6C. FIGS. 6A-6C are cross-sectional views in plane-4 through the exposed SiGe-containing fins 330 and the dummy gate structure 360, in accordance with some embodiments.

As shown in FIG. 6A, an offset spacer 670, such as a silicon nitride offset spacer, may be formed along the sides of the dummy gate structure 360 prior to implantation 702 to prevent implantation too close to the metal gate to be formed. In certain embodiments, an implanting of dopants to form lightly doped source/drain (LDD) regions may be conducted. One or more implantations 702 are performed to introduce dopants into the SiGe-containing fins 330 and the liner 216 to form top lightly doped source/drain (LDD) regions 798T on the top of the SiGe-containing fins 330. The implantation 702 may comprise a boron (B) dopant, such as a boron difluoride ($BF_2$). The implantation may be performed at an energy between an range of approximately 1 KeV and approximately to KeV, with a dose having a range of between approximately e13 $cm^{-2}$ and approximately 1e16 $cm^{-2}$, at a tilt angle having a range of between approximately 0 degrees and approximately 5 degrees, and at a depth from the top of the SiGe-containing fins 330 in a range from about to nm to about 20 nm.

In certain embodiments, implanting dopants to form lightly doped source and drain (LDD) regions is omitted due to the formation of p-doped source/drain regions and dopant diffusion during later stages in fabricating the semiconductor device.

As shown in FIG. 6B, a layer for the gate spacers 680 is conformally formed along sidewalls of the dummy gate structure 360 on the offset spacer 670. The gate spacers 680 and the offset spacer 670 may be comprised of the same or different material. The gate spacers 680 may be made of silicon carbon nitride, silicon nitride, silicon carbide, silicon oxynitride, silicon oxide, other applicable materials, or a combination thereof. The layer for the gate spacers 680 may be deposited by a chemical vapor deposition (CVD), atomic layer deposition (ALD), high density plasma CVD (HDPCVD), plasma enhanced CVD (PECVD), or other suitable deposition processes. The layers for the gate spacers 680 and offset spacers 670 may be anisotropically etched such that the gate spacers 680 and offset spacers 670 remain along the sidewalls of the dummy gate structure 360.

Areas of the SiGe-containing fins 330 not covered by the dummy gate structure 360, gate spacers 680, or offset spacers 670 are etched to form recesses 682, such as by a dry etching process and/or a wet etching process. For example, recesses 682 may be formed by an anisotropic wet etchant, such as tetramethylammonium hydroxide (TMAH). TMAH produces <111> planes within recesses 682 to form a 'V' shaped or diamond shaped recess. In certain embodiments, the substrate 202 may be etched by a TMAH etchant comprising an aqueous solution having a concentration of TMAH in a range from 1% to 30% with an etching temperature in a range from 20° C. to 90° C.

The recesses 682 may be formed to have either an angular, rounded, or flat shape on a bottom and/or sidewall of the recesses 682. The recesses 682 may be formed to a desired depth in the SiGe-containing fins 330. For example, the depth of the recesses 682 may be a depth in a range from 30 nm and to 100 nm. In certain embodiments, the recesses 682 are formed at least partially in the lower part 212 of the semiconductor alloy film 210.

As shown in FIG. 6C, an epitaxial material is deposited in recesses 682 to form doped source/drains 790. Epitaxial material may be a silicon-containing material, such as a silicon germanium material, formed by selective epitaxial growth in the recesses 682. In one embodiment, the doped source/drains 790 comprises a first SiGe layer (L1) 792, a second SiGe layer 794 (L2-1), and a third SiGe layer (L2-2) 796. Deposition methods include chemical vapor deposition (CVD), low pressure CVD (LPCVD), atomic layer CVD (ALCVD), ultrahigh vacuum CVD (UHVCVD), reduced pressure CVD (RPCVD), vapor-phase epitaxy (VPE), molecular beam epitaxy (MBE), any other suitable deposition process, or any combinations thereof.

For example, in one embodiment, selective epitaxial growth may include a plurality of in-situ epitaxial deposition and in-situ partial etch processes to assist in selective epitaxial growth over crystalline surfaces and to reduce crystal defects of the grown epitaxial films. For example, the partial etching process may use an etching gas, such as hydrogen chloride (HCl), chlorine ($Cl_2$), other suitable etching gases, and/or any combinations thereof. The partial etching process removes amorphous material over non-crystalline surfaces at a rate higher than the removal rate of epitaxial or crystalline material. Therefore, epitaxial film may primarily remain on surfaces of the recesses 682 of FIG. 6B.

The deposition of the silicon-containing material may include in-situ doping the silicon-containing material, in accordance with some embodiments. The doping species include p-type dopants, such as boron or antimony. In-situ doping may include monolayer doping, solid state doping, plasma doping, selective epitaxy, or other suitable deposition processes. For example, in-situ boron doped SiGe source/drains may be formed by a selective epitaxial growth process at a temperature in a range from 500° C. to 800° C. In another example, an epitaxial growth process may be performed at a pressure in a range from 10 Torr to 100 Torr. Processing gases may include HCl, $SiH_2Cl_2$ (dichlorosilane), $SiH_4$ (silane), $GeH_4$ (germane), difluroboron ($BF_2$), diborane ($B_2H_6$), $H_2$ carrier gas, other silicon precursors, other germanium precursors, other boron precursors, other etching gases, other carrier gases, and combinations thereof. By using the in-situ doping process, the dopant concentration (or level) of the doped source/drains 790 may be desirably controlled. In other embodiments, the source/drains 790 may be doped by implantation of dopants.

Figure 7:
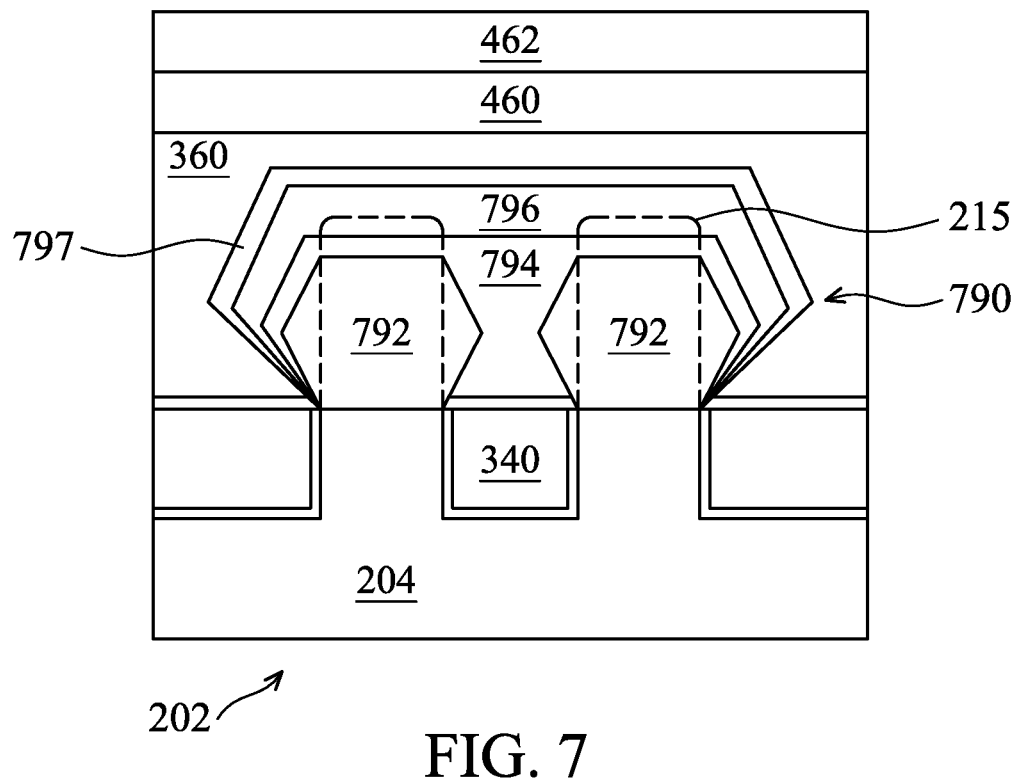
FIG. 7 is a cross-sectional view across doped source/drains and across recessed SiGe fins, in accordance with some embodiments.

FIG. 7 is a cross-sectional view in plane-2 across the doped source/drains 790 and across recessed SiGe-containing fins 330, in accordance with some embodiments. The doped source/drains 790 may comprise forming the first SiGe layer (L1) 792, forming the second SiGe layer 794 (L2-1), and forming the third SiGe layer (L2-2) 796. The SiGe layers 792, 794, 796 may be in-situ doped with boron. In certain embodiments, the boron concentration of the first SiGe layer (L1) 792 is less than the boron concentration of the second SiGe layer (L2-1) 794, and the boron concentration of the second SiGe layer (L2-1) 794 is less than the boron concentration of the third SiGe layer (L2-2) 796 (i.e., the boron concentration of SiGe first layer (L1) 792<the boron concentration of SiGe second layer (L2-1) 794<the boron concentration of SiGe third layer (L2-2) 796).

In certain embodiments, the first SiGe layer (L1) 792 may be deposited with a boron concentration in a range from $1 \times 10^{19}$ $cm^{-3}$ to $1 \times 10^{20}$ $cm^{-3}$. In certain embodiments, the second SiGe layer (L2-1) 794 may be deposited with a boron concentration in a range from $5 \times 10^{19}$ $cm^{-3}$ to $2 \times 10^{21}$ $cm^{-3}$. In certain embodiments, the third SiGe layer (L2-2) 796 may be deposited with a boron concentration in a range from $1 \times 10^{20}$ $cm^{-3}$ to $2 \times 10^{21}$ $cm^{-3}$.

Although doped source-drains 790 are illustrated as three layers, the doped source-drain 790 are not limited to such layers. In other embodiments, the doped source-drains 790 may comprise one SiGe layer or two SiGe layers. In other embodiments, the doped source-drains 790 may comprise additional layers (e.g., a fourth SiGe layer, a fifth SiGe layer, etc.).

In certain embodiment, the doped source/drains may comprise a capping layer (L3) 797. In certain aspects, the capping layer (L3) 797 may help reduce out diffusion of Ge or B from the SiGe layer 792, 794, 796. The capping layer (L3) 797 may comprise Si, SiGe, SiGeB, or other suitable materials. For example, the capping layer (L3) may comprise SiGeB with a Ge content in a range from 45% to 55%, a boron concentration in a range of $1 \times 10^{19}$ $cm^{-3}$ to $1 \times 10^{20}$ $cm^{-3}$, and a thickness in range from 5 nm to 15 nm.

In certain embodiments, the doped source/drains 790 comprise SiGe with a germanium content which increases from a bottom of the doped source/drains to a top of the source/drains 790. For example, the doped source-drains 790 comprise a bottom layer (i.e., first layer SiGe (L1) 792) with a germanium content in a range from 30% to 50% and a top layer (i.e., third SiGe layer (L2-2) 796) with a germanium content in a range from 50% to 70%.

Epitaxial growth of the doped source/drains 790 with a germanium content which increases from a bottom layer to a top layer of the source/drains 790 may be formed by changing a deposition parameter selected from the group consisting of a substrate heater temperature, a deposition pressure, and a gas flow ratio of a germanium precursor to a silicon precursor. For example, in certain embodiments, the bottom layer of the SiGe source/drains 790 may be formed at a first deposition temperature in a range from 500° C. to 600° C. and the top layer of the SiGe source/drains 790 may be formed at a second deposition temperature in a range from 700° C. to 800° C.

The doped source/drains 790 may induce strain in the channels 215. For example, the doped source/drains 790 comprising silicon germanium may induce a compressive strain within the channels 215 comprised of silicon germanium. In certain embodiments, the doped source/drains 790 have a germanium content greater than the channels 215.

An optional capping layer may be formed over doped source/drains 790, such as a capping layer of silicon. In certain embodiments, the capping layer helps protect the underlying SiGe from environmental effects, such as oxidation and humidity. The capping layer may also be used to form better ohmic contacts with a metal used to make electrical contact with the doped source/drains 790.

FIG. to is a graph 1000 of a germanium content in SiGe source/drains 790, in accordance with some embodiments. Line 1010 is the atomic percent content of germanium in the SiGe source drains 790 starting at depth 0 (top of the source/drains). As shown in the graph 1000, the germanium content is about 55% at a top layer 1020 of the SiGe source/drain and about 40% at a bottom layer 1030 of the SiGe source/drain 790.

As shown in FIG. 7, two doped source/drains 790 are formed as a merged doped source/drain. In certain embodiments, the first SiGe layer (L1) 792 of adjacent doped source/drains 790 are unmerged and the second SiGe layer (L2-1) 794 and above (i.e., the third SiGe layer (L2-2) 796, etc.) are merged. In certain aspects, unmerged first SiGe layers (L1) 792 and merged second SiGe layers (L2-1) 794 provide enhanced induced strain characteristics to the channels 215.

In other embodiments, doped source-drains may be formed as an unmerged doped source-drain. The growth of the doped source/drains 790 may be other shapes depending on the bottom surface of the recess 682 and depending on a lateral and a vertical growth of the selective epitaxial growth of the doped source/drains 790.

Figure 8A:
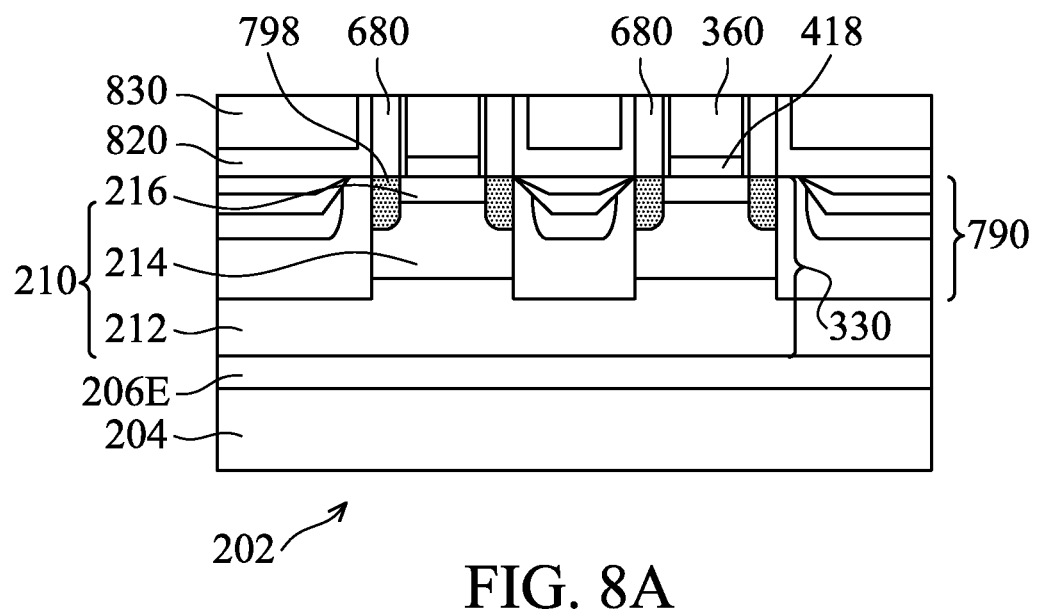
FIGS. 8A-E are cross-sectional views through source/drains, in accordance with some embodiments.

FIGS. 8A-E are cross-sectional views in plane-4 through source/drains 790, in accordance with some embodiments. In FIG. 8A, an etch stop layer 820 may be deposited over the source/drains 790, the gate spacer 680, and the dummy gate structure 360. The etch stop layer 820 may be deposited by chemical vapor deposition (CVD), physical vapor deposition (PVD), atomic layer deposition (ALD), high density plasma CVD (HDPCVD), metal organic CVD (MOCVD), plasma enhanced CVD (PECVD), or other suitable deposition processes. The etch stop layer 820 may comprise silicon nitride, silicon carbon nitride, silicon carbon oxide, carbon nitride, the like, or combinations thereof.

An inter-layer dielectric 830 may be deposited over the etch stop layer 820 by a deposition process, such as chemical vapor deposition (CVD), physical vapor deposition (PVD), atomic layer deposition (ALD), high density plasma CVD (HDPCVD), metal organic CVD (MOCVD), or plasma enhanced CVD (PECVD). For example, the inter-layer dielectric 830 may be silicon oxide, silicon nitride, silicon oxynitride, phospho-silicate glass (PSG), boro-silicate glass (BSG), boron-doped phospho-silicate glass (BPSG), or other dielectric layers. A removal process may be performed, such as a CMP process, to planarize the inter-layer dielectric 830 and etch stop layer 820, while removing mask layers 460, 462 of FIG. 6C.

Figure 8B:
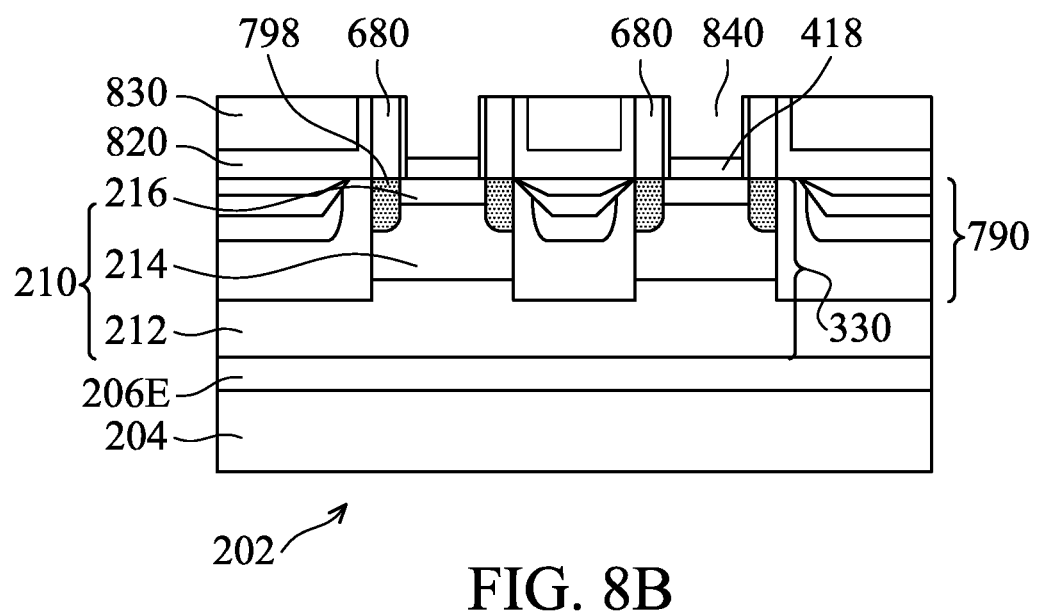
Figure 8C:
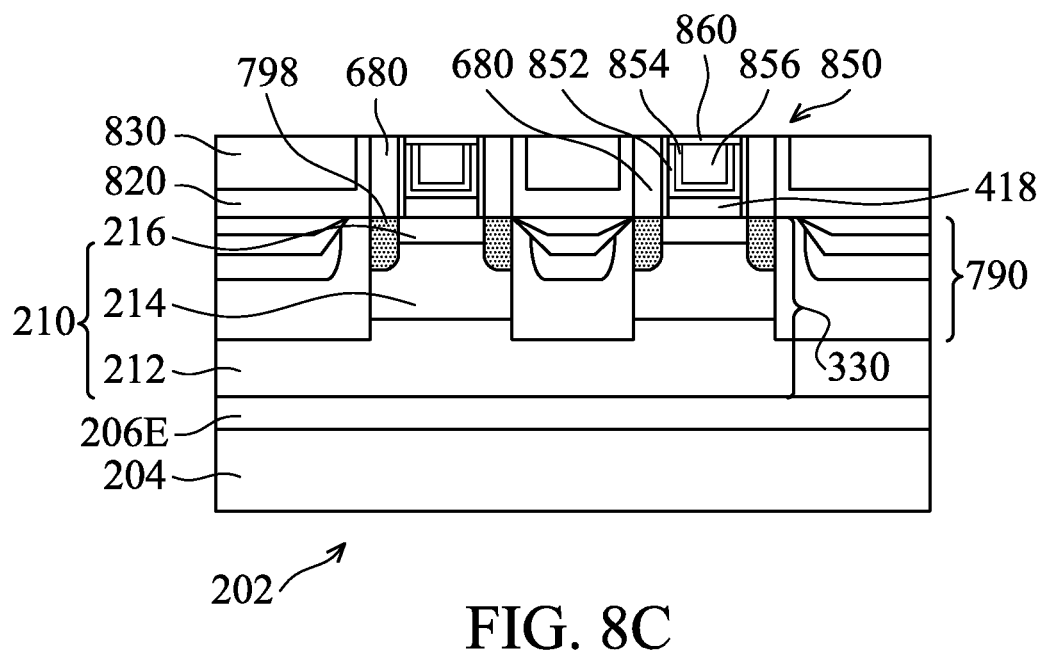

In FIG. 8B, the dummy gate structure 360 of FIG. 8A is removed, such as by a dry etch process and/or wet etch process, to form trenches 840. In FIG. 8C, the trenches 840 are filed with a gate stack 850. The gate stack includes a conformal gate dielectric layer 852. The gate dielectric layer 852 may be a silicon oxide, silicon nitride, or multilayers thereof. In certain embodiments, the gate dielectric layer 852 may comprises a high-k dielectric material, such as gate dielectric having a k value greater than about 7.0, and may include a metal oxide or a silicate of Hf, Al, Zr, La, Mg, Ti, Y, Sc, Lu, Gd, Sr, Dy, Ca, Sm, and combinations thereof. For example, the high-k dielectric material may include, but are not limited to, hafnium oxide ($HfO_2$), hafnium silicon oxide (HfSiO), hafnium tantalum oxide (HfTaO), hafnium titanium oxide (HfTiO), hafnium zirconium oxide (HfZrO), zirconium oxide, titanium oxide, aluminum oxide, hafnium dioxide-alumina ($HfO_2$—$Al_2O_3$) alloy, or other applicable dielectric materials. The formation methods of the gate dielectric layer 852 may include atomic layer deposition (ALD), plasma enhanced chemical vapor deposition (PECVD), or other suitable deposition processes.

The gate stack 850 includes one or a plurality of metal liner layers 854, such as a capping layer, a barrier metal layer, and/or work function metal layer. A capping metal layer and a barrier metal layer are used to prevent impurities from entering underlying layers. The capping layer and/or barrier layer may include tantalum nitride, titanium nitride, the like, or combinations thereof, and may be deposited by ALD, PECVD, or other suitable deposition processes.

A work function layer is chosen to tune its work function value so that a desired threshold voltage Vt is achieved in the transistor that is formed. Examples of a work function metal layer for n-type devices include Ti, Ag, TaAl, TaAlC, TAlAlN, TaC, TaCN, TaSiN, Mn, Zr, other suitable work function materials, or combinations thereof. Examples of a work function metal layer for p-type devices include TIN, TaN, Ru, Mo, Al, WN, $ZrSi_2$, $MoSi_2$, $TaSi_2$, $NiSi_2$, WN, other suitable work function materials, or combinations thereof. The work function metal layer may be conformally deposited, such as by chemical vapor deposition processes, such as by ALD, PECVD, or other suitable deposition processes.

A conductive gate 856 is formed over the metal liner layer 854. The conductive gate 856 may comprise a metal-containing material such as titanium nitride (TiN), tantalum nitride (TaN), tantalum carbon (TaC), cobalt (Co), ruthenium (Ru), aluminum (Al), titanium aluminum nitride (AlTiN), titanium aluminum carbon (AlTiC), titanium aluminum oxide (AlTiO), combinations thereof, and multi-layers thereof. The conductive gate may be deposited by a suitable process, such as chemical vapor deposition (CVD), physical vapor deposition (PVD or sputtering), atomic layer deposition (ALD), plasma enhanced chemical vapor deposition (PECVD), plating, or other deposition techniques. The gate stack 850 wraps around the sides and the top of the SiGe-containing fins 330 to form channels.

A dielectric capping layer 860, such as a silicon oxynitride (SiON) layer, may be formed over the conductive gate. In other manufacturing stages, the dielectric capping layer 860 may be removed and a contact layer deposited over the conductive gate 856.

Figure 8D:
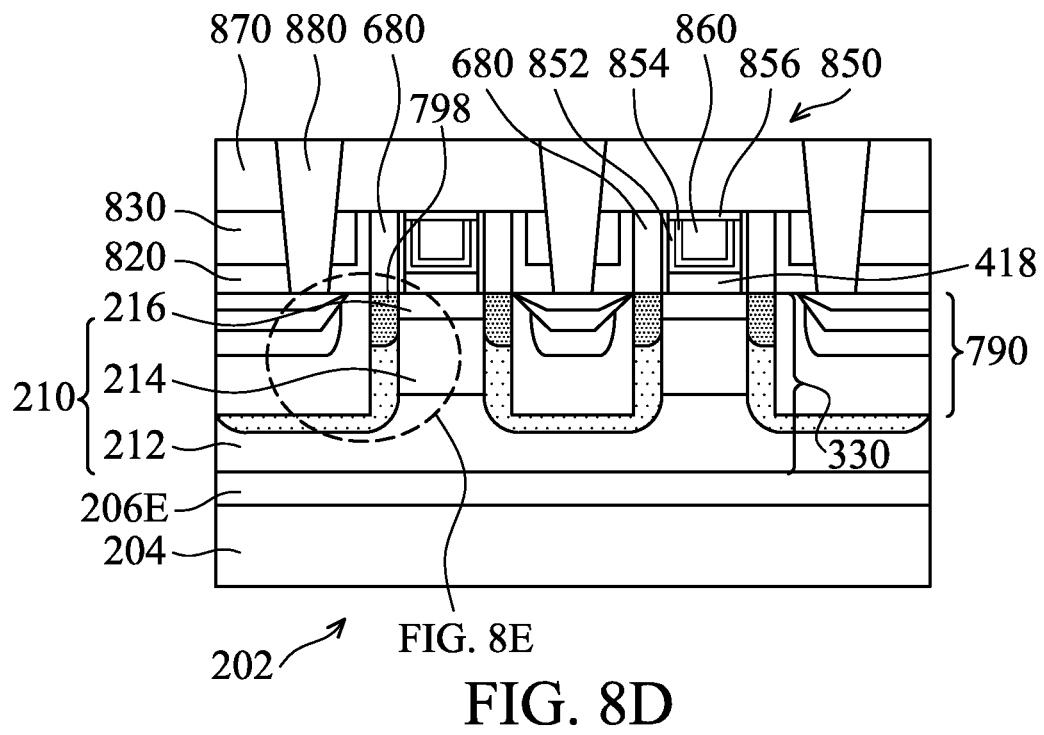

As shown in FIG. 8D, an inter-layer dielectric 870 may be deposited over the substrate 202 by a deposition process, such as chemical vapor deposition (CVD), physical vapor deposition (PVD), atomic layer deposition (ALD), high density plasma CVD (HDPCVD), metal organic CVD (MOCVD), or plasma enhanced CVD (PECVD). For example, the inter-layer dielectric 870 may be silicon oxide, silicon nitride, silicon oxynitride, phospho-silicate glass (PSG), boro-silicate glass (BSG), boron-doped phospho-silicate glass (BPSG), or other dielectric layers.

The inter-layer dielectric 870 may be patterned to form openings that are filled with metal, such as copper, tungsten, or other suitable metals, to form contacts 880 contacting the source/drains 790. The contacts 880 may be deposited by PVD, electrochemical deposition, CVD, combinations thereof, or other suitable deposition processes.

Figure 8E:
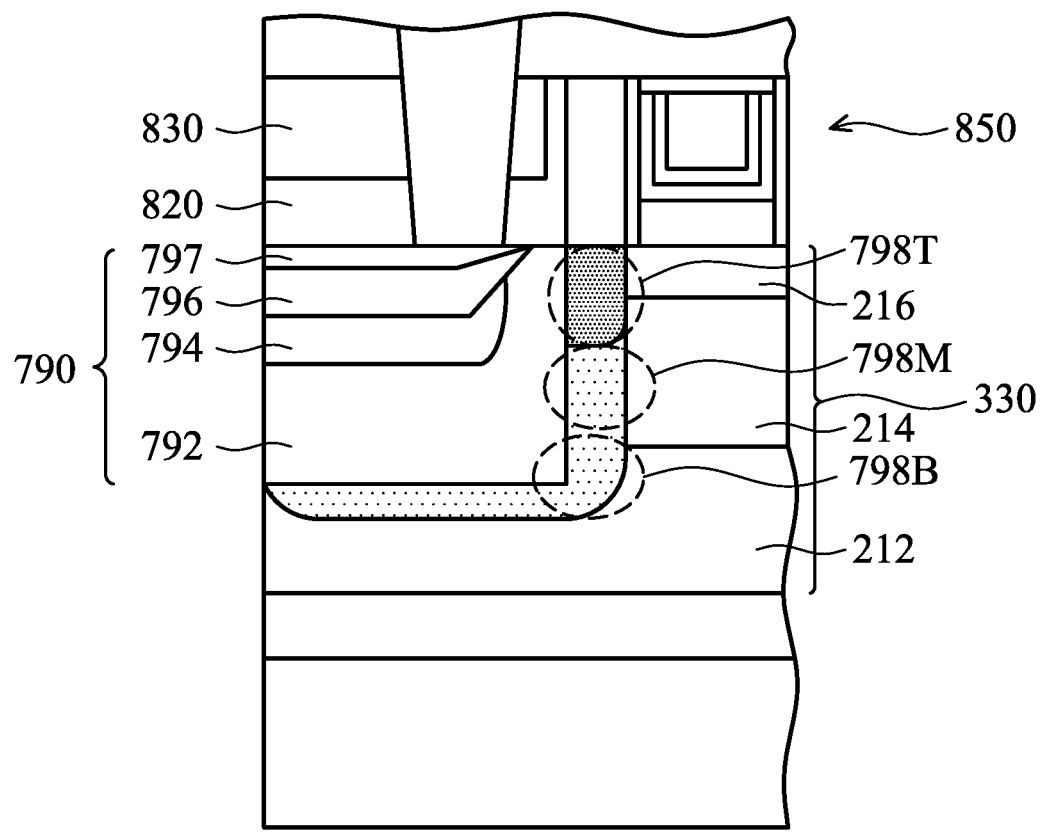

FIG. 8E shows an enlarged section of FIG. 8D illustrating the LDD regions in accordance with some embodiments. In certain embodiments, dopants from doped source/drains 790 may diffuse into the upper part 214 to form a middle LDD region 798M. Dopants from doped source/drains 790 may diffuse into the lower part 212 to form a bottom LDD region 798B. Top LDD region 798T formed primarily by implantation of dopants on the top of the upper part 214 of the SiGe-containing fins 330, middle LDD region 798M, and bottom LDD region 798B may collectively be referred to as LDD regions 798. Dopant profiles of the middle LDD region 798M and bottom LDD region 798B formed by diffusion of dopants may continuously decrease from an interface between, e.g., the source/drain 790 and the semiconductor alloy film 210 in a direction toward the channel of the device, whereas a dopant profile of the top LDD region 798T formed primarily by implantation of dopants may be substantially uniform from an interface between, e.g., the source/drain 790 and the semiconductor alloy film 210 in a direction toward the channel of the device before decreasing.

In certain embodiments, the widths of the top LDD region 798T, of the middle LDD region, of the bottom LDD region 798B are 5 Å or smaller. The width of the LDD regions 798 are determined based upon the desired width of the channel 215. A small width LDD helps to maintain the width of the channel 215 reducing short channel effects.

For example, at block 180 of the method 140, the dopants may diffuse during in-situ doping of the source/drain 790 into the SiGe-containing fin 330 to form lightly doped source/drain (LDD) regions 798. In certain embodiments, annealing, such as a rapid thermal anneal (RTA) and/or laser annealing process, may be performed to activate doped source/drains 790 and/or to cause diffusion of the dopants into the SiGe-containing fin 330 to form lightly doped source/drain (LDD) regions 798. In some embodiments, the annealing temperature is higher than the melting temperature of SiGe source/drains 790 and the SiGe-containing fins 330. For example, the annealing temperature may be in a range from about 500° C. and about 700° C. for a time period in a range from about 5 seconds to 30 seconds. Due to the lower content of Ge in the lower part 212 of the SiGe-containing fin 330, a dopant profile at the bottom of the SiGe-containing fin 330 may be enhanced to form LDD regions 798 at least partially at the lower part 212 of the SiGe-containing fin 330. The LDD regions 798 formed at least partially at the lower part 212 of the SiGe-containing fin 330 provide enhanced transistor characteristics.

Figure 8F:
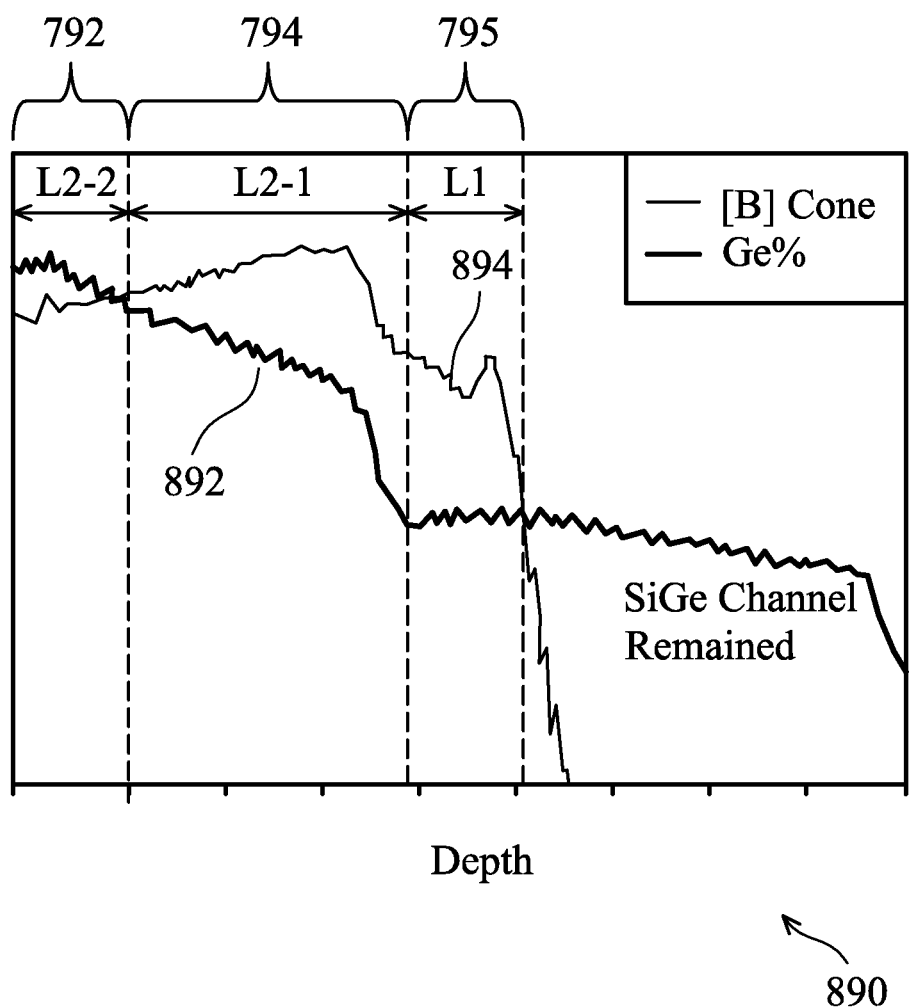
FIG. 8F is a graph of a germanium content and a boron concentration in a source/drain, in accordance with some embodiments.

FIG. 8F is a graph 890 of a germanium content and boron concentration in a source/drain 790, in accordance with some embodiments. Line 892 is an atomic percent content of germanium in the source/drain 790 starting at the top of the third SiGe layer (L2-2) 796, then the second SiGe layer (L2-1) 794, then the first SiGe layer (L1) 792, and then the lower part 212 of the recessed SiGe-containing fin 330.

Line 894 is the boron concentration in the source/drain 790 starting at the top of the third SiGe layer (L2-2) 796, then the second SiGe layer (L2-1) 794, then the first SiGe layer (L1) 792, and then the lower part 212 of the recessed SiGe-containing fin 3300.

In the embodiment of FIG. 8F, the third SiGe layer (L2-2) 796 has a germanium content in a range from about 45% to about 65%. The third SiGe layer (L2-2) 796 has a boron concentration in a range from about $1\times10^{20}$ cm$^{-3}$ to $2\times10^{21}$ cm$^{-3}$. The third SiGe layer (L2-2) 796 is formed to a thickness in a range from about to nm to about 20 nm.

In the embodiment of FIG. 8F, the second SiGe layer (L2-1) 794 has a germanium content in a range from about 35% to about 55%. The second SiGe layer (L2-1) 794 has a boron concentration in a range from about $5\times10^{19}$ cm$^{-3}$ to $2\times10^{21}$ cm$^{-3}$. The second SiGe layer (L2-1) 794 is formed to a thickness in a range from about 30 nm to about 40 nm.

In the embodiment of FIG. 8F, the first SiGe layer (L1) 792 has a germanium content in a range from about 25% to about 35%. The first SiGe layer (L1) 792 has a boron concentration in a range from about $1\times10^{19}$ cm$^{-3}$ to $1\times10^{20}$ cm$^{-3}$. The first SiGe layer (L1) 792 is formed to a thickness in a range from about to nm to about 20 nm.

It is understood that two SiGe fins and two gate structures are shown in FIGS. 5-8 for illustration purposes only. The fins and gate structures may be formed in any number as needed depending on the application. While the gate structures discussed herein are fabricated using a replacement gate process, it is contemplated that the gate structures may be fabricated using a gate-first process as understood by those skilled in the art. While the source/drains discussed herein are fabricated using a recessed fin, source/drains may be fabricated over a doped fin, such as by in-situ doping or by implantation, without forming recesses in the fin.

It is understood that the semiconductor devices and methods of manufacture may also include additional layers, such as photoresist layers, mask layers, diffusion barrier layers, capping layers, silicide areas, etch stop layers, dielectric layers, adhesion layers, and the other suitable layers. The semiconductor devices and methods may also include additional manufacturing processes including photoresist coating (e.g., spin-on coating), soft baking, mask aligning, exposure, post-exposure baking, developing the photoresist, rinsing, drying, hard baking, inspection, planarization, chemical mechanical polishing (CMP), wet clean, ashing, and/or other applicable processes.

In is understood that the p-type FET devices may also be integrated with the formation of n-type FET devices. It is understood that the substrate may include a plurality of layers (such as conductive layers, semiconductive layers, insulating layers) and/or features (doped regions or wells, fins, source/drain regions, isolation regions, shallow trench isolation (STI) feature, gate structures, interconnect lines, vias, and other suitable features) formed in, on, and/or over the substrate. The plurality of layers and/or features is used in the fabrication of semiconductor devices and integrated circuits. The substrate may also include additional materials formed in, on, and/or over the substrate in the blocks of the methods and in the figures as described herein.

As described in certain embodiments of FIGS. 3-8, the LDD 798 of the SiGe-containing fins 330 may have improved dopant characteristics. With a lower germanium content in the lower part 212 of the semiconductor alloy film 210 forming the SiGe-containing fins 330, boron diffusion into the lower part 212 of the SiGe-containing fins 330 is enhanced. For example, the lower part of the SiGe fins may include diffused dopants from the dopant source/drain 790 to form lightly doped source/drain (LDD) regions 798. The diffusion of dopants into the upper part 214 and the lower part 212 form LDD regions 798 more uniformly across the SiGe-containing fins 330 since the dopant concentration is less impacted by the shadowing effect of the gate structures 360 (including gate first structure, dummy gate structures, and replacement gate structures). Therefore, the threshold voltage of the FinFET devices may have less variations. In certain embodiments, source/drain resistance (Rsd) may be reduced due to increased dopants at the bottom LDD region 798B.

In certain embodiments, a partially strained or fully strained channel 215 is provided by having strain inducing doped source/drains 790. In certain embodiments, the channel 215 and the doped source/drains 790 comprise silicon and germanium in which the doped source/drains 790 contain a greater content of germanium to induce a partial or full strain in the channel 215.

In certain embodiments, the doped source/drains 790 provide an improved interface with the SiGe-containing fins 330 and provide improved transistor characteristics. In certain embodiments, recessing the SiGe-containing fins 330 and forming doped source/drains 790 over the recessed SiGe-containing fins 330 enables a reduced source/drain resistance.

In certain embodiments, the formation of the SiGe-containing fins 330 with a gradient content of germanium allows omitting implantation steps to form LDD regions. Therefore, too high a concentration of dopants at the top of the SiGe-containing fins 330 in the channels 215 may be avoided reducing short channel effects.

In certain embodiments, a semiconductor device includes a substrate having an n-doped well feature and an epitaxial silicon germanium fin formed over the n-doped well feature. The epitaxial silicon germanium fin includes a lower part and an upper part, wherein the lower part has a lower germanium content than the upper part. A channel is formed from the epitaxial silicon germanium fin. Lightly doped source-drain regions (LDD) are formed from the epitaxial silicon germanium fin. The lightly doped source-drain regions are formed proximate the channel.

In certain embodiments, a semiconductor device includes a substrate having an n-doped well feature and an epitaxial silicon germanium fin formed over the n-doped well feature. The epitaxial silicon germanium fin includes a lower part and an upper part. The lower part has a lower germanium content than the upper part. A channel is formed from the epitaxial silicon germanium fin. A gate is formed over the epitaxial silicon germanium fin. A doped source-drain is formed proximate the channel.

In certain embodiments, a method of manufacturing a semiconductor device includes forming an epitaxial silicon germanium fin formed over an n-doped well feature. The epitaxial silicon germanium fin has a lower part and an upper part. The lower part has a lower germanium content than the upper part. A dummy gate structure is formed over the epitaxial silicon germanium fin. A doped source-drain is formed proximate the channel. Dopants are diffused from the source-drain regions into the epitaxial silicon germanium fin to form lightly doped source-drain regions.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device, the method comprising:
    forming an epitaxial silicon germanium fin over an n-doped well feature, wherein the epitaxial silicon germanium fin comprises a lower part and an upper part, wherein the upper part has a greater germanium content than the lower part;
    forming a dummy gate structure over a channel region of the epitaxial silicon germanium fin;
    forming a doped source-drain proximate the channel region; and
    diffusing dopants from the doped source-drain into the epitaxial silicon germanium fin to form lightly doped source-drain regions.

2. The method of claim 1, wherein the greater germanium content of the epitaxial silicon germanium fin is formed by changing a deposition parameter selected from the group consisting of a substrate heater temperature, a pressure, and a gas flow ratio of a germanium precursor to a silicon precursor.

3. The method of claim 1, wherein the greater germanium content of the epitaxial silicon germanium fin is formed by epitaxially depositing at a first deposition temperature in a range from 500° C. to 750° C. and epitaxially depositing at a second deposition temperature in a range from 700° C. to 800° C.

4. The method of claim 1, wherein a height thickness of the lower part is greater than a thickness of the upper part.

5. A method of manufacturing a semiconductor device, the method comprising:
    forming a fin protruding from a substrate;
    forming a gate structure over the fin;
    forming recesses in the fin along opposing sides of the gate structure;
    epitaxially growing source/drain regions in the recesses, wherein the source/drain regions comprise dopants; and
    diffusing a part of the dopants from the source/drain regions into respective lightly-doped drain (LDD) regions, wherein each of the respective LDD regions comprises a bottom LDD region and a middle LDD region, wherein the middle LDD region has a dopant concentration decreasing as the middle LDD region extends away from the source/drain regions toward a channel region of the fin.

6. The method of claim 5, wherein forming the fin comprises epitaxially growing one or more semiconductor layers over the substrate.

7. The method of claim 6, wherein epitaxially growing the one or more semiconductor layers comprises epitaxially growing a first silicon germanium layer over the substrate, wherein the first silicon germanium layer has a first germanium content.

8. The method of claim 7, wherein epitaxially growing the one or more semiconductor layers comprises epitaxially growing a second silicon germanium layer over the first silicon germanium layer, wherein the second silicon germanium layer has a second germanium content, wherein the second germanium content is greater than the first germanium content.

9. The method of claim 8 further comprising epitaxially growing a silicon layer over the second silicon germanium layer.

10. The method of claim 5, wherein the gate structure is a dummy gate structure and further comprising replacing the gate structure with a replacement gate structure.

11. The method of claim 5 further comprising, prior to recessing the fin, implanting dopants into the fin along opposing sides of the gate structure.

12. The method of claim 5, wherein the source/drain regions comprise silicon germanium and the fin comprises silicon germanium, wherein the source/drain regions have a higher germanium content than the fin.

13. The method of claim 5, wherein a width of the respective LDD regions is 5 angstroms or smaller.

14. The method of claim 5, wherein diffusing the part of the dopants is performed at least in part by a rapid thermal anneal (RTA) or laser annealing process.

15. The method of claim 5, wherein the bottom LDD region has a dopant concentration decreasing as the bottom LDD region extends away from the source/drain regions toward the channel region.

16. The method of claim 5, wherein each of the respective LDD regions further comprises a top LDD region, wherein the top LDD region has a uniform dopant concentration.

17. A method of manufacturing a semiconductor device, the method comprising:
    forming a fin protruding from a substrate, wherein the fin comprises first semiconductor layer and a second semiconductor layer over the first semiconductor layer, wherein the first semiconductor layer comprises a different semiconductor material than the second semiconductor layer;
    forming a dummy gate structure over the fin;
    forming a lightly-doped region in the fin;
    forming a recess in the fin adjacent the dummy gate structure, wherein the recess extends through the lightly-doped region, wherein a portion of the lightly-doped region adjacent the recess forms an upper LDD region;
    epitaxially growing a source/drain region in the recess, wherein the source/drain region comprises dopants of a first conductivity type; and
    annealing to diffuse the dopants of the first conductivity type from the source/drain region into a middle LDD region, wherein the middle LDD region has a dopant concentration of the dopants of the first conductivity type decreasing as the middle LDD region extends away from the source/drain region toward a channel region in the fin.

18. The method of claim 17, wherein the first semiconductor layer comprises a first silicon germanium layer, wherein the second semiconductor layer comprises a silicon layer.

19. The method of claim 17, wherein the first semiconductor layer and the second semiconductor layer comprise silicon germanium with different germanium concentrations.

20. The method of claim 17, wherein forming the upper LDD region comprises implanting dopants into the fin.

* * * * *

UNITED STATES PATENT AND TRADEMARK OFFICE
CERTIFICATE OF CORRECTION

PATENT NO.           : 10,930,781 B2
APPLICATION NO.      : 16/710156
DATED                : February 23, 2021
INVENTOR(S)          : Shahaji B. More It is certified that error appears in the above-identified patent and that said Letters Patent is hereby corrected as shown below:

In the Claims

In Column 17, Line 44, Claim 4, delete "height".

In Column 18, Line 41, Claim 17, delete "comprises first" and insert --comprises a first--.

Signed and Sealed this
Twenty-fifth Day of May, 2021

Drew Hirshfeld
*Performing the Functions and Duties of the*
*Under Secretary of Commerce for Intellectual Property and*
*Director of the United States Patent and Trademark Office*